United States Patent
Kobayashi

(10) Patent No.: US 12,504,683 B2
(45) Date of Patent: Dec. 23, 2025

(54) IMPRINT APPARATUS, IMPRINT METHOD, STORAGE MEDIUM, AND METHOD OF MANUFACTURING ARTICLE

(71) Applicant: CANON KABUSHIKI KAISHA, Tokyo (JP)

(72) Inventor: Kenichi Kobayashi, Tochigi (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 222 days.

(21) Appl. No.: 18/177,400

(22) Filed: Mar. 2, 2023

(65) Prior Publication Data

US 2023/0305388 A1    Sep. 28, 2023

(30) Foreign Application Priority Data

Mar. 24, 2022    (JP) ................................. 2022-047720

(51) Int. Cl.
*G03F 7/00*    (2006.01)

(52) U.S. Cl.
CPC .................................. *G03F 7/0002* (2013.01)

(58) Field of Classification Search
CPC .................................................... G03F 7/0002
See application file for complete search history.

(56) References Cited

U.S. PATENT DOCUMENTS

| | | |
|---|---|---|
| 7,090,716 B2 | 8/2006 | McMackin et al. |
| 7,270,533 B2 | 9/2007 | McMackin et al. |
| 7,531,025 B2 | 5/2009 | McMackin et al. |
| 2016/0327857 A1 | 11/2016 | Kimura |
| 2019/0332007 A1* | 10/2019 | Yamashita ............ G03F 7/0002 |
| 2020/0189175 A1* | 6/2020 | Nawata ............... H01L 21/3086 |
| 2022/0388230 A1* | 12/2022 | Murakami .............. B29C 59/02 |

(Continued)

FOREIGN PATENT DOCUMENTS

| | | |
|---|---|---|
| JP | 2007509769 A | 4/2007 |
| JP | 2011146447 A | 7/2011 |
| JP | 2015138842 A | 7/2015 |

(Continued)

OTHER PUBLICATIONS

Office Action issued in Korean Appln. No. 10-2023-0034515, mailed Oct. 13, 2025.

*Primary Examiner* — Steven H Whitesell
(74) *Attorney, Agent, or Firm* — ROSSI, KIMMS & McDOWELL LLP

(57) ABSTRACT

An imprint apparatus comprising a plurality of gas supply units configured to supply a gas to a space between a mold and a substrate; and a control unit configured to control the gas supply units and an imprint operation to sequentially imprint on a plurality of imprint regions of the substrate; wherein the control unit acquires position information of the imprint regions on the substrate, imprint order information, and predetermined gas supply amount information for each of the imprint regions, and wherein, at the time of an imprint operation of the imprint region just before a movement direction between the imprint regions of the substrate is to be changed from a first direction to a second direction, the control unit controls both of a first direction side and a second direction side of the plurality of gas supply units to supply a predetermined amount of the gas based on the gas supply amount information.

16 Claims, 16 Drawing Sheets

(56) References Cited

U.S. PATENT DOCUMENTS

2023/0288797 A1* 9/2023 Miyoshi ............ H01L 21/31144

FOREIGN PATENT DOCUMENTS

| JP | 2016058735 A | 4/2016 |
| JP | 2017117958 A | 6/2017 |
| JP | 2019091741 A | 6/2019 |
| JP | 2019102735 A | 6/2019 |

* cited by examiner

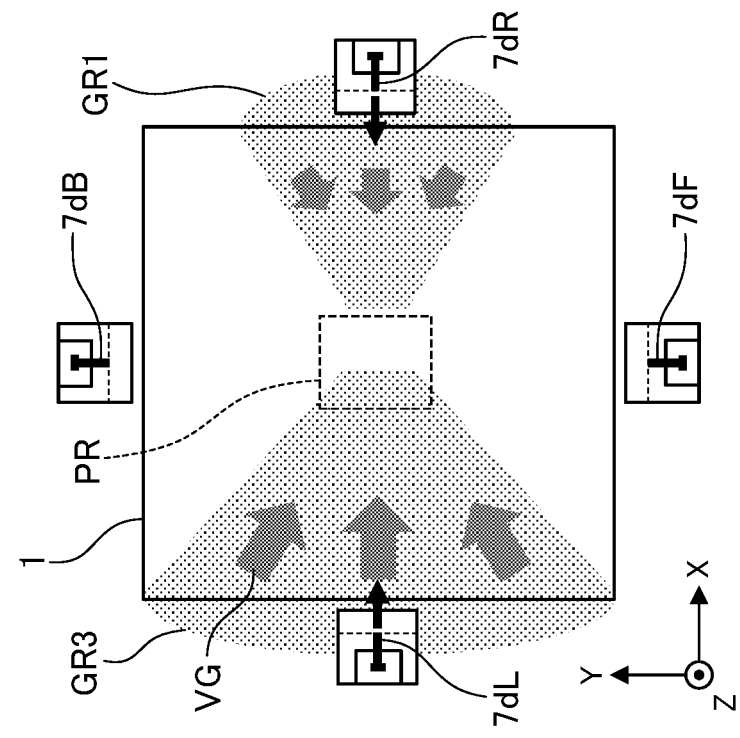
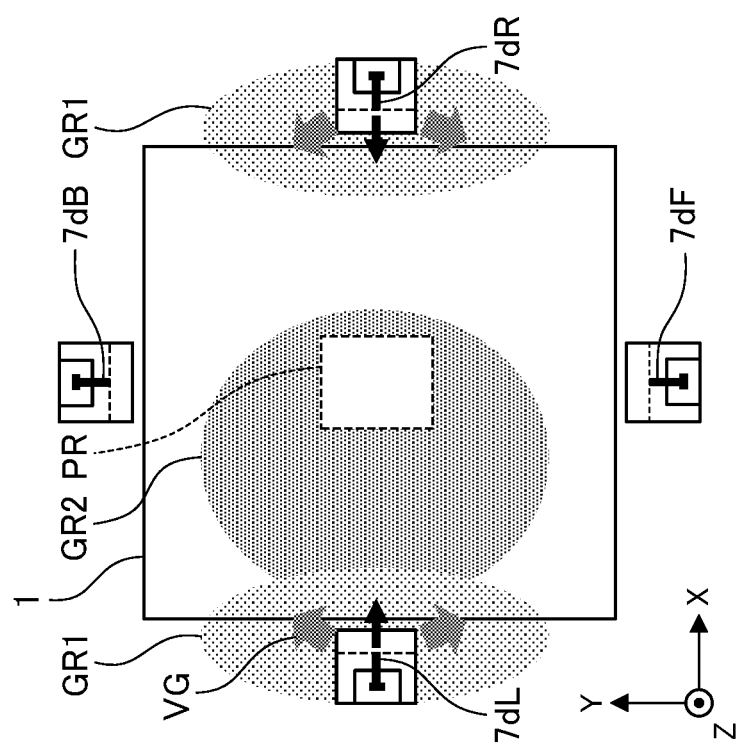
FIG. 7A
FIG. 7B

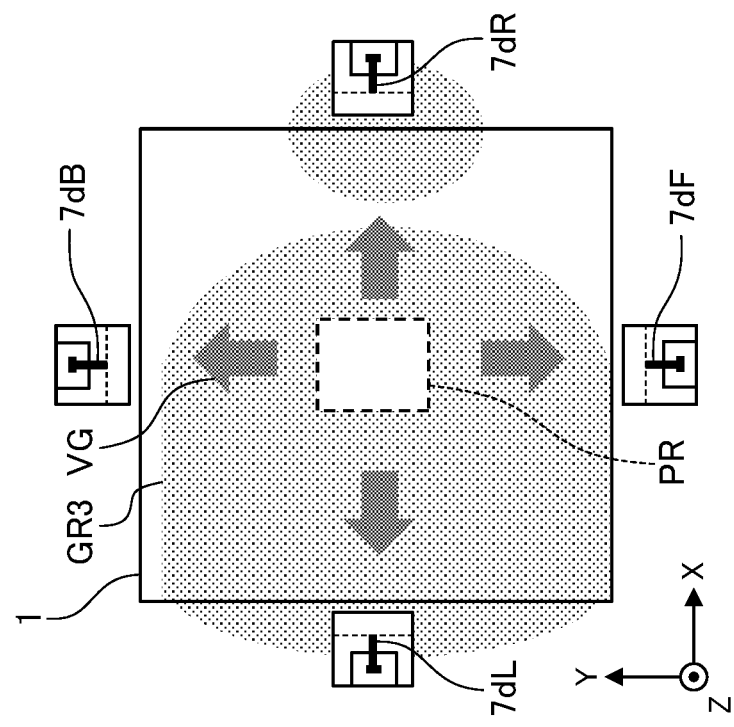
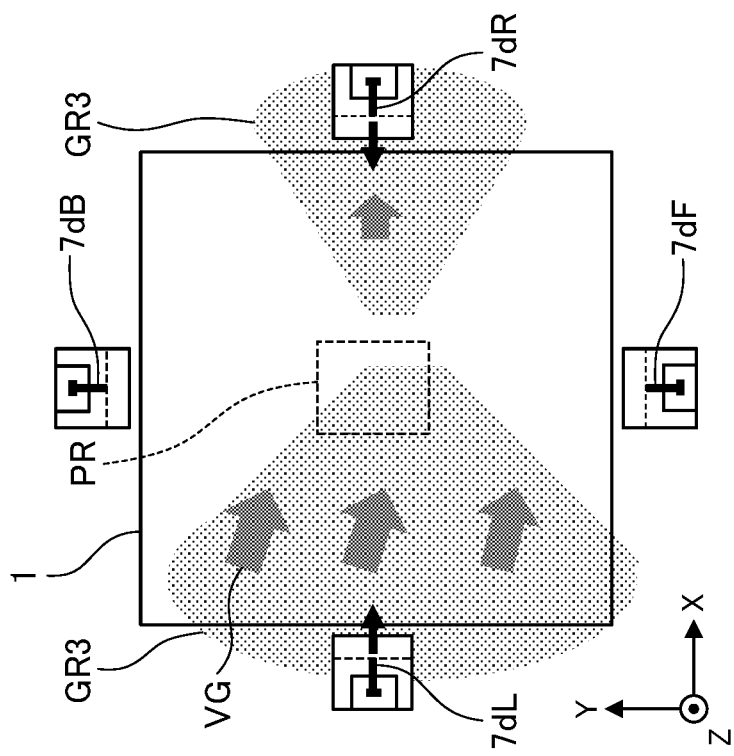

IMPRINT APPARATUS, IMPRINT METHOD, STORAGE MEDIUM, AND METHOD OF MANUFACTURING ARTICLE

BACKGROUND OF THE INVENTION

Field of the Invention

The present invention relates to an imprint apparatus, an imprint method, a storage medium, and a method of manufacturing an article.

Description of the Related Art

With a growing demand for the miniaturization of semiconductor devices, attention has been drawn to, in addition to conventional photolithography techniques, a microfabrication technique of molding an imprint material on a substrate and curing the molded composition, thereby forming a pattern on the substrate. Such a technique is called an imprint technique, and it can form a fine pattern on a substrate in the order of a few nanometers.

One example of the imprinting technique is a light curing method. An imprint apparatus that employs the light curing method forms a pattern on a substrate by bringing a mold into contact with light-curing imprint material that is supplied on the apparatus (imprinting), curing the imprint material by light irradiation, and then separating the mold from the cured imprint material (mold release).

At the time of imprinting, air (residual gas) between the mold and the imprint material may mix into an uncured imprint material as air bubbles, resulting in unfilling defects (pattern defects) in some cases. Therefore, in Japanese Patent Laid-Open No. 2007-509769, the space between a mold and a substrate is saturated with a gas having high solubility, high diffusivity, or both with respect to the imprint material (hereinafter, simply referred to as "gas"), thereby minimizing the amount of residual air bubbles.

Further, the imprint apparatus of PCT Japanese Translation Patent Publication No. 2019-91741 shows a configuration in which a gas is supplied in a state in which a mold and imprint material are brought into contact with each other, and a gas is supplied to a space between the mold and the substrate when the mold and the imprint material are separated.

In such an imprint apparatus, the concentration (density) of gas may decrease when continuously imprinting a plurality of regions on a substrate. This may cause defects and reduce the productivity of the imprint apparatus. Further, in the exposure step of curing the imprint material, because the exposure light leaks outside the imprint region, the imprint material on an adjacent imprint region is photosensitized.

Because this unanticipated photosensitization increases the viscoelasticity of the imprint material, it degrades alignment accuracy. In a case in which photosensitization has progressed further, an unfilling defect is caused. Thus, it is necessary to properly control the concentration of a replacement gas in view of the influence on the adjacent imprint regions. That is, because the concentration of the replacement gas adversely affects factors other than filling properties, it is not sufficient to simply increase the gas concentration so as to be high, but it is necessary to adjust it to an appropriate concentration.

Further, even if a gas is supplied to each imprint region at a constant gas supply amount, there is a problem in that the gas concentration becomes uneven near the center and near the outer periphery of the substrate. This is because gas is easily diffused in the gap between the substrate edge portion and a substrate holding member, thereby resulting in a lower gas concentration in the outer peripheral portion of the substrate.

Accordingly, it is an object of the present invention to apply an imprint apparatus that is capable of supplying an appropriate gas to each imprint region of a substrate when performing imprinting.

SUMMARY OF THE INVENTION

One aspect of the present invention is an imprint apparatus, comprising at last one processor or circuit configured to function as:
 a plurality of gas supply units configured to supply a gas to a space between a mold and a substrate; and
 a control unit configured to control the gas supply units and an imprint operation to sequentially imprint on a plurality of imprint regions of the substrate;
 wherein the control unit acquires position information of the imprint regions on the substrate, imprint order information, and predetermined gas supply amount information for each of the imprint regions, and
 wherein, at the time of an imprint operation of the imprint region just before a movement direction between the imprint regions of the substrate is to be changed from a first direction to a second direction, the control unit controls both of a first direction side and a second direction side of the plurality of gas supply units to supply a predetermined amount of the gas based on the gas supply amount information.

Further features of the present invention will become apparent from the following description of embodiments with reference to the attached drawings.

BRIEF DESCRIPTION OF THE DRAWINGS

FIG. 7A is a schematic diagram of the XY plane in a step S104, which is a filling step in an imprint region IR07, and FIG. 7B is a schematic diagram of the XY plane in a mold release step S106 in the imprint region IR07.

FIG. 8A is a schematic diagram of the XY plane in a moving step S102 when moving from the imprint region IR07 to an imprint region IR08. FIG. 8B is a schematic XY plan view of an imprint step S103 in the imprint region IR08.

DESCRIPTION OF THE EMBODIMENTS

Hereinafter, with reference to the accompanying drawings, favorable modes of the present invention will be described using Embodiments. In each diagram, the same reference signs are applied to the same members or elements, and duplicate description will be omitted or simplified.

First Embodiment

In the first embodiment and the accompanying drawings, directions are shown by using an XYZ coordinate system in which a plane with a direction parallel to a surface of a substrate is on the XY plane. Directions parallel to an X axis, a Y axis, and a Z axis in the XYZ coordinate system are referred to as an X direction, a Y direction, and a Z direction, respectively, and rotation around the X axis, rotation around the Y axis, and rotation around the Z axis are referred to as θX, θY, and θZ, respectively.

Control or driving with respect to the X axis, the Y axis, and the Z axis refers to control or driving in a direction parallel to the X axis, a direction parallel to the Y axis, and a direction parallel to the Z axis, respectively. Positioning refers to controlling a position, an attitude, or an inclination. Alignment can include controlling a position, an attitude, and an inclination of at least one of a substrate and a mold.

Figure 1A:
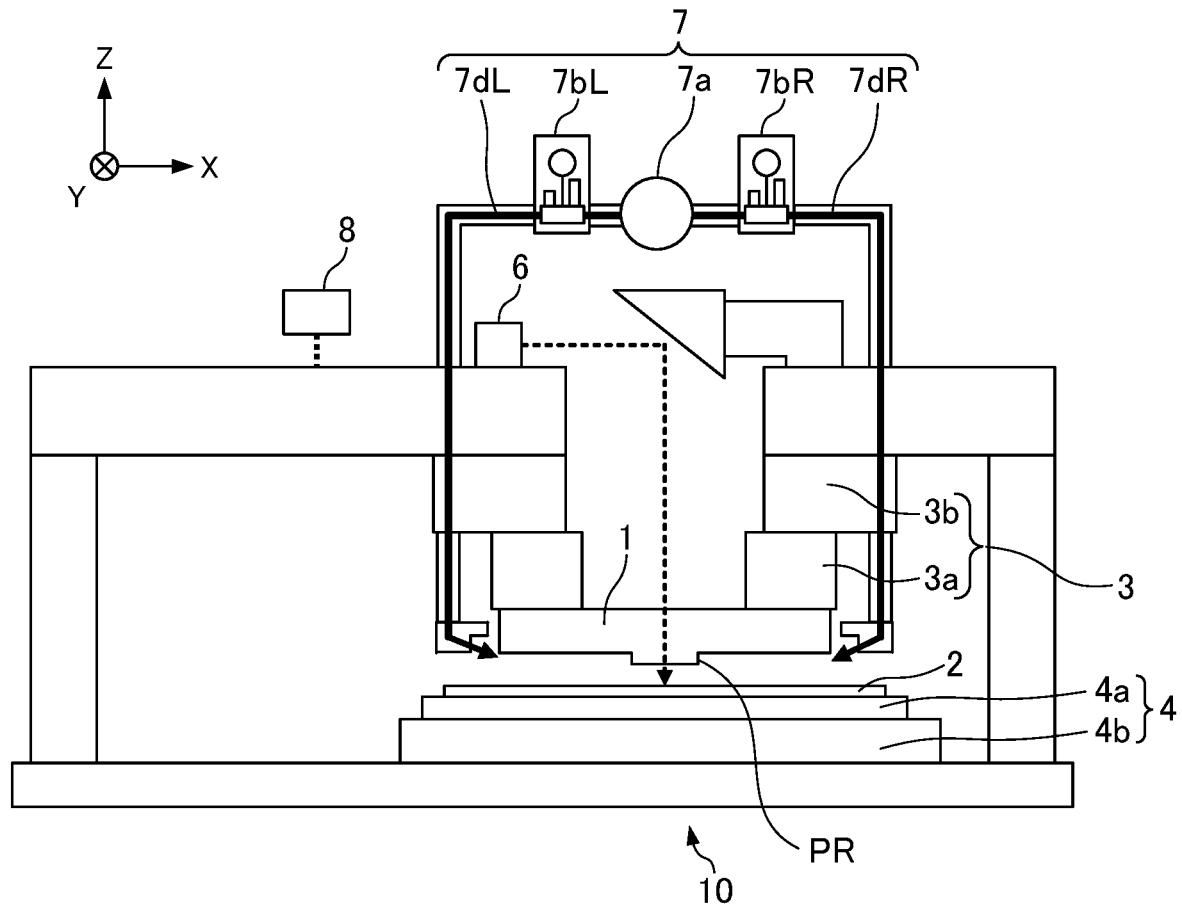
FIG. 1A is a schematic diagram showing the imprint apparatus according to a first embodiment.

FIG. 1A is a schematic diagram showing the imprint apparatus according to a first embodiment. An imprint apparatus 10 is a lithography apparatus that is used for a process of manufacturing an article such as a semiconductor apparatus.

The imprint apparatus 10 performs an imprint process of bringing (imprinting) an imprint material supplied onto a substrate into contact with (on) a pattern region of a mold, providing curing energy to the imprint material to cure the imprint material, and releasing the mold from the imprint material. Thereby, a pattern of a cured product is transferred and formed on the substrate by a concave and convex pattern of the pattern region of the mold.

A curable composition (sometimes referred to as an uncured resin) cured by curing energy being applied to the curable composition is used as an imprint material. As curing energy, electromagnetic waves, heat, and the like are used. As electromagnetic waves, light such as infrared rays, visible rays, and ultraviolet rays whose wavelengths are selected from a range of equal to or greater than 10 nm or equal to or less than 1 mm are used.

Curable compositions are compositions cured by light irradiation or heating. Among these, a photocurable composition cured by light irradiation may include at least a polymerizable synthetic compound and a photopolymerization initiator, and include a non-polymerizable synthetic compound or a solvent as necessary. The non-polymerizable synthetic compound is at least one selected from the group of a sensitizer, a hydrogen donor, an internal additive type releasing agent, a surfactant, an antioxidant, a polymer component, and the like.

An imprint material may be applied onto a substrate in the form of a film by spin-coating or slit-coating. Furthermore, an imprint material may be applied onto a substrate in the form of droplets or in the form of islands or films obtained by connecting a plurality of droplets through a liquid discharging head. The viscosity (viscosity at 25° C.) of the imprint material can be, for example, equal to or greater than 1 m Pa·s or equal to or less than 100 m Pa·s.

The imprint apparatus 10 includes, for example, a mold positioning unit 3 configured to hold a mold 1 and position the mold 1, a substrate positioning unit 4 configured to hold a substrate 2 and position the substrate 2, a curing unit 6, a gas supply unit 7, and a control unit 8.

The mold 1 has, for example, a rectangular outer form and is configured by a material such as quartz through which it is possible to transmit ultraviolet rays are transmitted. A surface of the mold 1 facing the substrate 2 has a pattern region PR. In the pattern region PR, a concave and convex pattern to be transferred to an imprint material on the substrate 2 is formed in a three-dimensional shape. The pattern region PR is also referred to as a mesa, and is formed in a convex shape of several tens μm to several hundred μm so that a region other than the pattern region PR of the mold 1 does not come into contact with the substrate 2.

The substrate 2 is configured by, for example, a semiconductor (for example, silicon or a compound semiconductor), a glass, a ceramic, a metal, a resin, or the like. The substrate 2 can have one or a plurality of layers on a base material. In this case, the base material is configured by, for example, a semiconductor, a glass, a ceramic, a metal, a resin, or the like. An adhesion layer can be provided on the substrate 2 to improve the adhesion between the imprint material and the substrate 2, if necessary. A plurality of imprint regions are formed on the substrate 2.

The mold positioning unit 3 can include a mold holding unit 3a and a mold driving mechanism 3b. The mold holding unit 3a holds the mold 1, for example, by using a vacuum suction force, an electrostatic force, or the like. The mold driving mechanism 3b is a driving system for changing a distance between the mold 1 and the substrate 2.

The mold driving mechanism 3b drives (moves) the mold 1 in a Z-axis direction by driving the mold holding unit 3a. The mold driving mechanism 3b includes, for example, an actuator such as a linear motor, and an air cylinder and drives the mold holding unit 3a having the mold 1 held therein.

The mold driving mechanism 3b is configured to drive the mold 1 (the mold holding unit 3a) with respect to a plurality of axes (for example, the three axes of the Z axis, the θX axis, and the θY axis). In order to realize highly accurate positioning of the mold 1, the mold driving mechanism 3b may include a plurality of driving system such as a coarse driving system and a fine driving system. Furthermore, the mold driving mechanism 3b may have a function of driving the mold 1 and a function of correcting an inclination of the mold 1 in the Z-axis direction as well as in an X-axis direction, a Y-axis direction, and a θZ direction.

The substrate positioning unit 4 can include a substrate holding unit 4a configured to hold the substrate 2, and a substrate driving mechanism 4b. The substrate holding unit 4a holds the substrate 2 by using, for example, a vacuum suction force, an electrostatic force, or the like.

The substrate driving mechanism 4b drives (moves) the substrate 2 in the X-axis direction and the Y-axis direction by driving the substrate holding unit 4a. The substrate driving mechanism 4b includes an actuator such as a linear motor and an air cylinder, and drives the substrate holding unit 4a having the substrate 2 held therein.

The substrate driving mechanism 4b can be configured to drive the substrate 2 (the substrate holding unit 4a) with respect to a plurality of axes (for example, the three axes of the X axis, the Y axis, and the θZ axis, preferably, the six axes of the X axis, the Y axis, the Z axis, the θX axis, the θY axis, and the θZ axis).

The substrate driving mechanism 4b may include a plurality of driving systems such as a coarse driving system and a fine driving system. The substrate driving mechanism 4b may have a function of driving the substrate 2 in the Z-axis direction and θ (rotation around the Z axis) direction, and a function of correcting an inclination of the substrate 2.

The mold positioning unit 3 and the substrate positioning unit 4 are mechanisms configured to drive the mold 1 or the substrate 2 so that a relative position, a relative attitude, and a relative inclination with respect to an XY plane direction between the mold 1 and the substrate 2 are adjusted and the determination of the relative positions of the mold 1 and substrate 2 is carried out.

The mold positioning unit 3 and the substrate positioning unit 4 perform alignment for reducing a relative shift and an error component associated with rotation between the pattern region PR of the mold 1 and the imprint region of the substrate 2. In this case, the mold positioning unit 3 and the substrate positioning unit 4 may detect alignment marks provided on each of the mold 1 and the substrate 2 by using, for example, an alignment measurement unit (not shown), and perform alignment.

Further, the mold positioning unit 3 and the substrate positioning unit 4 are mechanisms configured to drive the mold 1 or the substrate 2 so that a relative position, a relative attitude, and a relative inclination in the Z direction between the mold 1 and the substrate 2 are adjusted. Adjustment of the relative position in the Z direction by using the mold positioning unit 3 or the substrate positioning unit 4 includes performing driving to bring (imprint) the pattern region PR of the mold 1 into contact with (on) the imprint material on the substrate 2 and separating (mold release) the pattern region PR of the mold 1 from the cured imprint material.

The distance d between the mold 1 and substrate 2 can be detected by, for example, a laser interferometer, an encoder, or the like provided in the mold positioning unit 3 or the substrate positioning unit 4, and as a result, can be changed based on the detection result. It should be noted that the method of detecting the distance d is not limited thereto.

The curing unit (irradiation unit) 6 causes the imprint material to be cured by supplying or radiating curing energy (for example, ultraviolet rays and the like) for curing the imprint material via the mold 1 in a state in which the imprint material on the imprint region of the substrate 2 is in contact with the pattern region of the mold 1. Thereby, a pattern consisting of the cured product made of the imprint material is formed.

In the first embodiment, the curing unit 6 has, for example, a light source configured to emit light (exposure light such as ultraviolet rays) for curing the imprint material. Furthermore, the curing unit 6 may include an optical element for adjusting light emitted from the light source such that it becomes suitable light in the imprint process.

In the first embodiment, although a light source configured to emit ultraviolet rays is used because a light curing method is used, for example, if a thermal cycling method is adopted, a heat source for curing a thermosetting resin serving as an imprint material is used instead of a light source.

The gas supply unit 7 supplies a replacement gas to a space between the mold 1 and the substrate 2, and replaces a gas in the space between the mold 1 and the substrate 2 with the replacement gas. In a state in which air bubbles have been incorporated between the mold 1 and the imprint material at the time of curing the imprint material, a place in which the air bubbles are present may not be filled with an imprint material, and defects can occur in the pattern of the cured product. At the time of imprinting, the gas supply unit 7 replaces a gas in the space between the mold 1 and the imprint material with a permeating gas which readily permeates into the mold 1 or the imprint material.

It should be noted that the gas supply unit 7 may replace the gas in the space between the mold 1 and the imprint material during imprinting with a condensable gas or the like which condenses and liquefies due to a pressure rise when the mold 1 is brought into contact with the imprint material.

Examples of the permeating gas include using helium gas (He), and examples of the condensable gas include using pentafluoropropane (PFP). In the first embodiment, a replacement gas is a permeating gas, a condensable gas and the like, and in a case in which simply "a gas" is referred to hereinafter, it refers to this replacement gas.

Figure 1B:
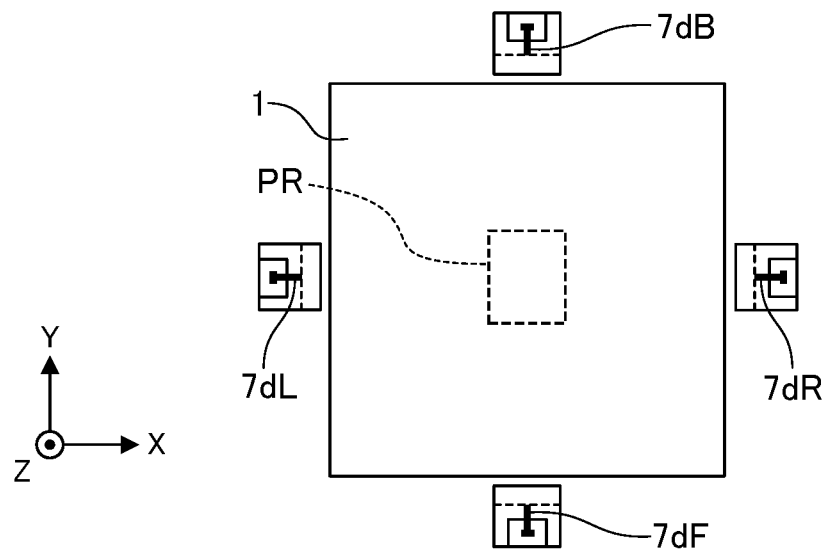
FIG. 1B is a diagram showing the arrangement of gas supply paths 7$d$L, 7$d$R, 7$d$B, and 7$d$F on the XY plane.

The gas supply unit 7 can include a gas supply source 7a, gas control units 7bL, 7bR, and 7bB (not shown), 7bF (not shown), and gas supply paths 7dL, 7dR, 7dB, and 7dF. FIG. 1B is a diagram showing the arrangement of gas supply paths 7dL, 7dR, 7dB, and 7dF on the XY plane. The gas supply source 7a is a replacement gas supply source and is provided with a tank filled with a gas, or is connected to an external gas supply source.

The gas control units 7bL, 7bR, 7bB (not shown), and 7bF (not shown) control a flow rate of a gas and are configured by, for example, mass flow controllers (MFCs). The gas supply paths 7dL, 7dR, 7dB, and 7dF are configured to be capable of releasing a gas through a plurality of supply ports that are disposed in the periphery of the mold 1 that is held in the mold positioning unit 3.

The gas supply paths 7dL, 7dR, 7dB, and 7dF are each connected to gas control units 7bL, 7bR, 7bB, and 7bF, respectively, and are configured to be capable of individually controlling a flow rate of a gas. A flow rate of a gas supplied from the gas supply source 7a is controlled by the gas control units 7bL, 7bR, 7bB, and 7bF, and the gas is discharged from the periphery of the mold 1 through the gas supply paths 7dL, 7dR, 7dB, and 7dF. Thereby, the replacement gas is supplied to the space between the mold 1 and the substrate 2.

The control unit 8 controls the mold positioning unit 3, the substrate positioning unit 4, the curing unit (irradiation unit) 6, the gas supply unit 7, and the like and controls the entire (operation) of the imprint apparatus 10. Furthermore, the control unit 8 incorporates a CPU as a computer and functions as a control unit that controls each part of the entire imprint apparatus 10 based on a computer program that is stored in a memory as a storage medium and performing an imprint operation.

Furthermore, the control unit 8 is configured of, for example, a PLD (Programmable Logic Device) such as an FPGA (Field Programable Gate Array), an ASIC (Application Specific Programable Circuit), or a combination of all or a part of these.

Figure 2:
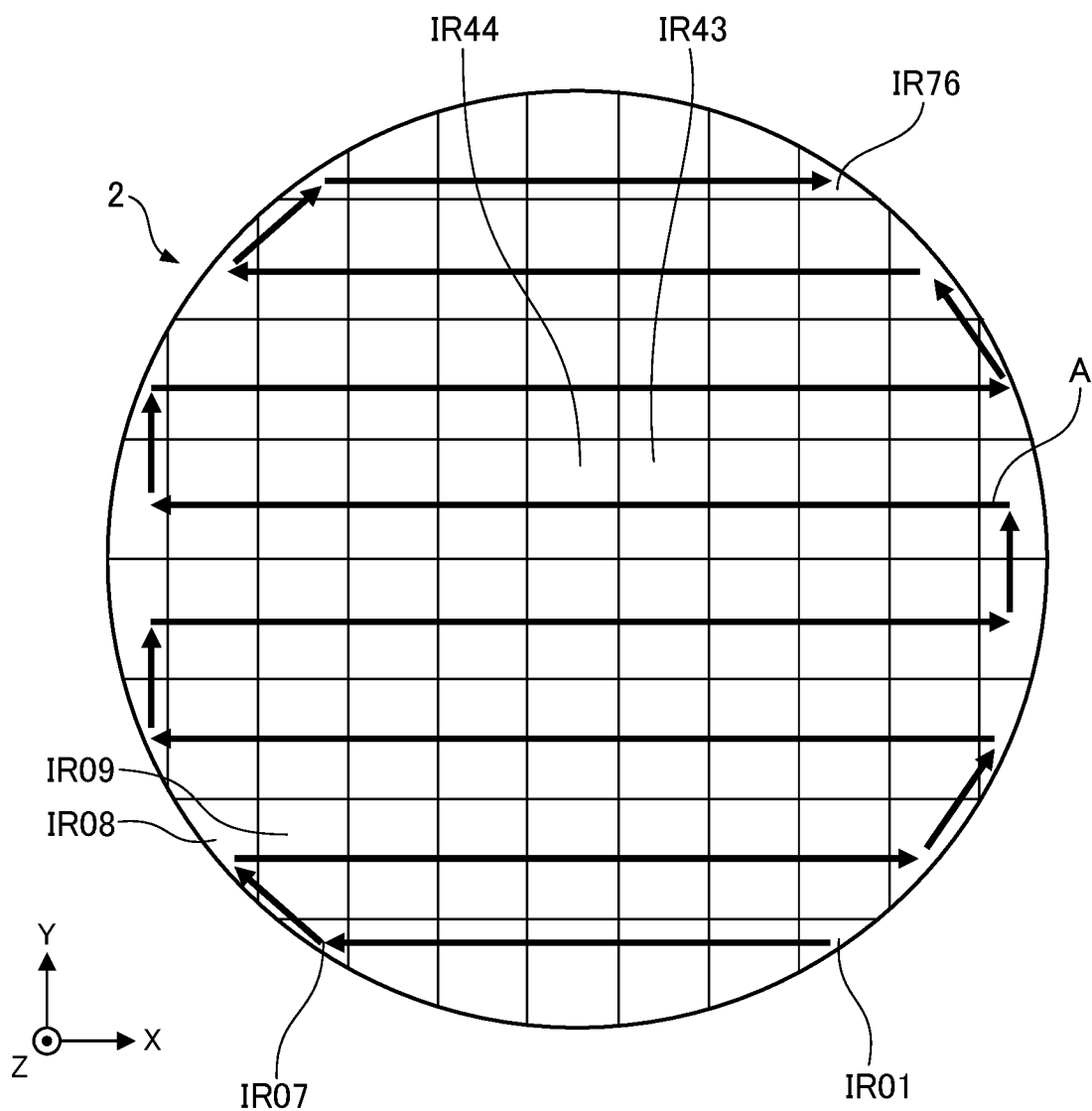
FIG. 2 is a diagram showing one example of an imprint region and an imprint order of a substrate 2.

FIG. 2 is a diagram showing one example of an imprint region and an imprint order of a substrate 2. Each imprint region is a region that is divided into a grid pattern with respect to the substrate 2 having a circular shape. Generally, the order in which the imprint process is performed is such that an imprint is performed on an adjacent imprint region in sequence so that the movement distance is shortened.

For example, as shown in FIG. 2, imprint regions IR01 through IR76 are imprinted sequentially in the order of arrow A. This imprint order is just one example, and, for example, the order may be reversed so that IR76 is first and IR01 is last.

Figure 3:
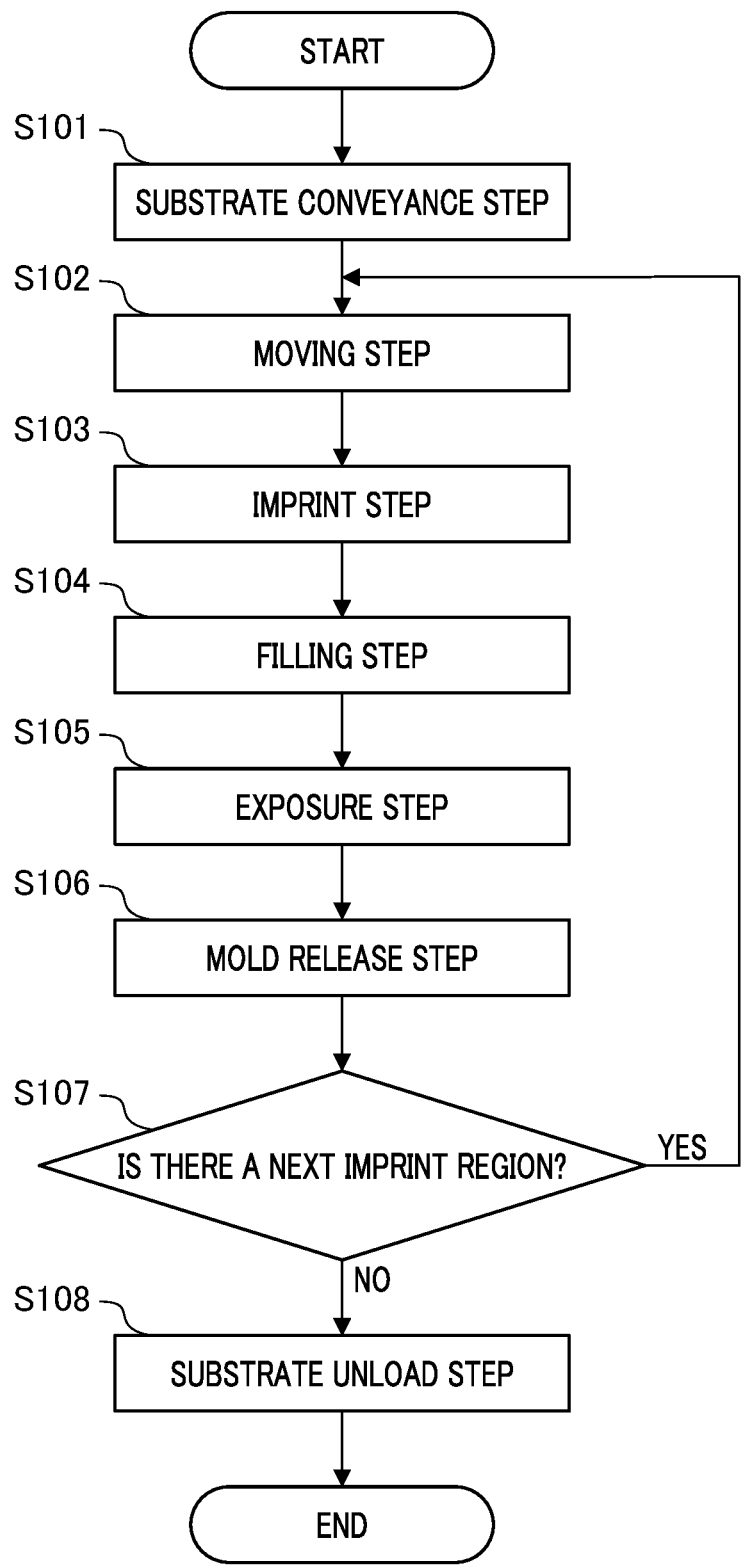
FIG. 3 is a flowchart showing an imprint process of an imprint apparatus 10 according to the first embodiment.

FIG. 3 is a flowchart showing an imprint process of an imprint apparatus 10 according to the first embodiment. It should be noted that each of the steps of the flowchart of FIG. 3 is performed by a computer within the control unit 8 executing a computer program stored in a memory.

FIG. 3 shows an example of a process of forming a pattern on a plurality of imprint regions of the substrate 2. These processes are controlled by the control unit 8. However, an explanation with respect to loading of the mold 1 to the mold holding unit 3a and unloading of the mold 1 from the mold holding unit 3a will be omitted.

In step S101, the substrate 2 that is to subsequently undergo imprint processing is conveyed to the substrate holding unit 4a. In the first embodiment, the substrate 2 is loaded into the imprint apparatus 10 in a state in which the imprint material has been applied in advance.

In the moving step S102, the substrate positioning unit 4 is driven so that the imprint region to be imprinted next on the substrate 2 is in a position which faces the pattern region PR of the mold 1.

In the imprint step S103, the mold positioning unit 3 is driven, and the pattern region PR of the mold 1 is pressed against the substrate 2.

In step S104, the mold 1 and the substrate 2 wait in a state in which the mold 1 and the substrate 2 are in contact with each other via the imprint material so that every corner of the pattern that is configured on the pattern region PR of the mold 1 is filled with imprint material. Further, in step S104, an alignment process for aligning the relative positions of the mold 1 and the substrate 2 is also performed in parallel.

In step S105, by using the curing unit 6, the imprint material is irradiated with light and cured. In the mold release step S106, the mold positioning unit 3 is driven, and the mold 1 is separated from the substrate 2.

In step S107, a determination is made as to whether there is a next imprint region. In a case in which there is a next imprint region, the process returns to the moving step S102, and the substrate 2 is moved to the next imprint position. In a case in which there is no next imprint region, the process proceeds to step S108. In step S108, the substrate 2 is unloaded from the substrate holding unit 4a, and the imprint process ends.

Next, a gas supply by the gas supply unit 7 will be explained with reference to FIG. 4 to FIG. 6. In FIGS. 4 through FIG. 6, an example of a gas supply in an imprint operation in a case in which the movement direction of the substrate does not change from imprint region IR43 to imprint region IR44 of FIG. 2 is shown.

FIGS. 4A to 4D are schematic cross-sectional views of the XZ plane mainly describing the mold 1, the substrate 2, and the gas supply paths 7dL and 7dR in the first embodiment. FIGS. 5A and 5B are schematic diagrams of the XY plane, mainly representing the mold 1 and the distribution of a gas in FIGS. 4A and 4B, and FIGS. 6A and 6B are schematic diagrams of the XY plane in FIGS. 4C and 4D, mainly representing the mold 1 and the distribution of a gas.

Figure 4A:
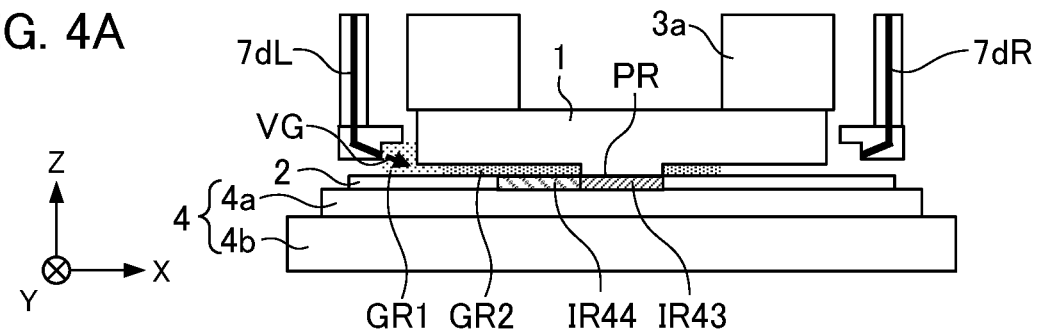
FIGS. 4A to 4D are schematic cross-sectional views of the XZ plane mainly disclosing a mold 1, the substrate 2, and gas supply paths 7$d$L and 7$d$R in the first embodiment.
Figure 5A:
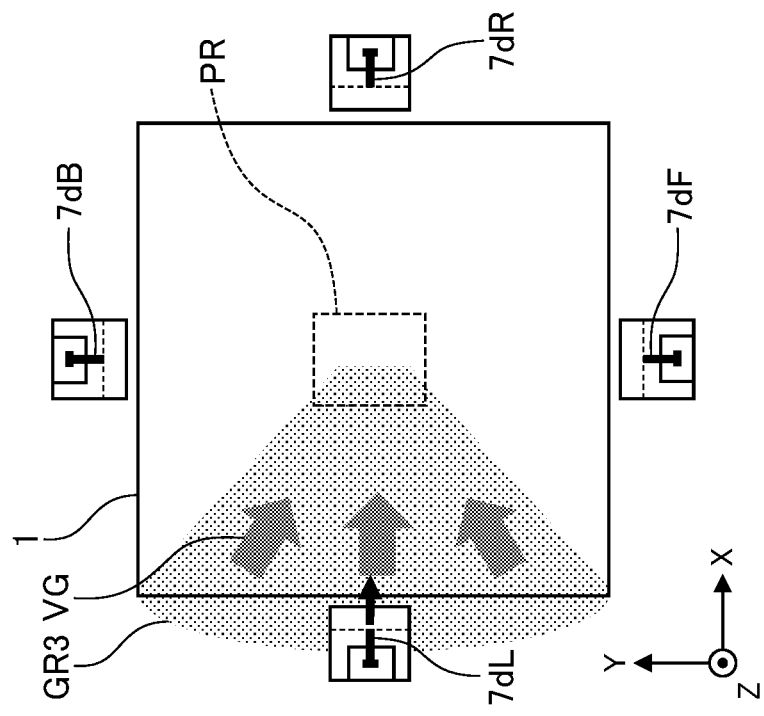
FIGS. 5A and 5B are schematic diagrams of the XY plane, mainly representing the mold 1 and the distribution of a gas in FIGS. 4A and 4B.
Figure 5B:
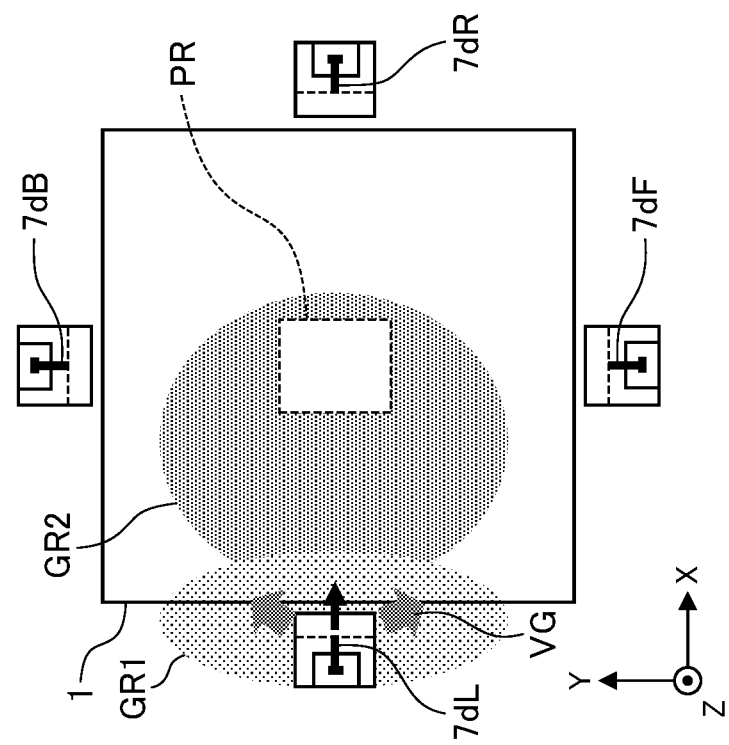

FIG. 4A is a schematic cross-sectional view in step S104, which is a filling step. At this time, an imprint is performed on the imprint region IR43. The next region in which an imprint is performed is the imprint region IR44. At this time, the gas is supplied from the gas supply path in the region direction (upstream side) in which the next imprint is performed. That is, as shown in FIG. 4A, the gas is supplied from the gas supply path 7dL.

The arrow VG shows the direction of gas flow. For simplicity, the region to which the gas has been supplied is shown in the figure as the gas region GR1. A gas region GR2 shows the gas that has been supplied when the imprint process was performed in the imprint region IR42 before the imprint region IR43. An imprint is performed by additionally supplying gas to this gas region GR2.

FIG. 5A is an XY plan view at the same timing as that of FIG. 4A. When viewed in the XY plane, the spread of the gas region GR1 is mainly in the Y direction. In a state in which the pattern region PR of mold 1 is in contact with the substrate 2, the distance d between the mold 1 and the substrate 2 is several tens μm, and less gas flows into this gap.

Therefore, the supplied gas is spread in the Y-direction in the space of the mask side surface. The gas region GR2 exists at the periphery of the pattern region PR. In practice, the supplied gas diffuses into the air over time, and the range of the gas region GR2 gradually narrows.

Figure 4B:
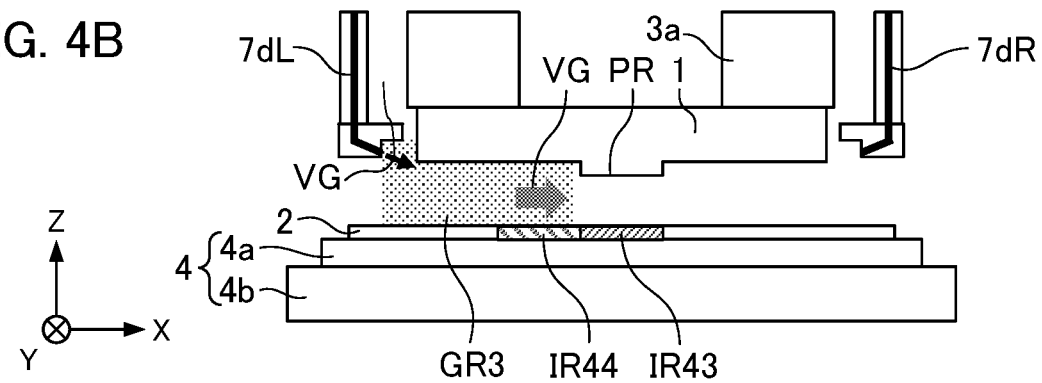

FIG. 4B is a schematic cross-sectional view in step S106, which is a mold release step. In this step, the mold 1 is separated from the substrate 2. When the mold 1 and the substrate 2 are separated, because a space is created therebetween, the gas flows therein from the periphery. Because the gas is supplied from gas supply path 7dL, the gas that was supplied to the region between the pattern region PR of the mold 1 and the gas supply path 7dL flows in toward the center direction of the mold 1.

Other surrounding air also flows in toward the pattern region PR (not shown). In FIG. 4A, the gas region GR2 that was supplied when the imprint step was performed immediately before and the gas region GR1 that is currently being supplied were shown separately. However, because they are gradually mixed, in FIG. 4B they are integrated and shown as a gas region GR3.

FIG. 5B is an XY plan view at the same timing as that of FIG. 4B. The gas region GR3 flows in the center direction of the mold 1. Air flows in from a region in which there is no gas.

Figure 4C:
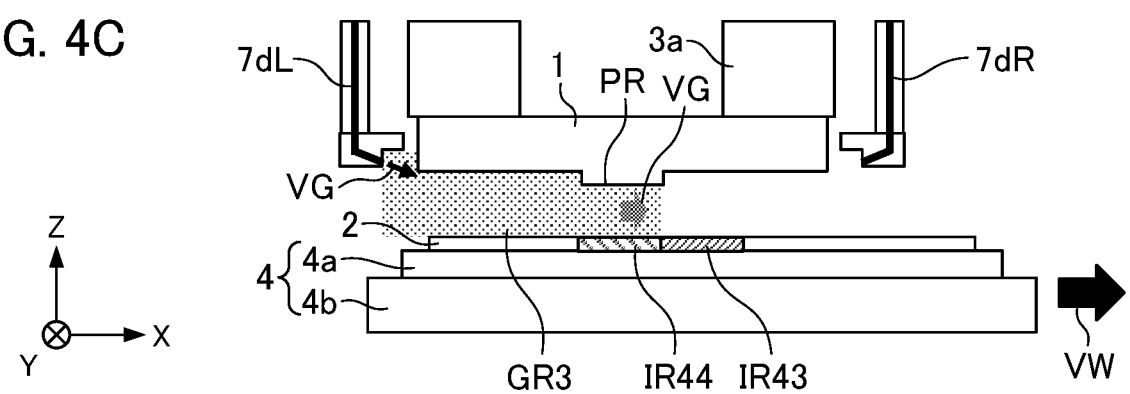

FIG. 4C is a schematic cross-sectional view in step S102, which is a moving step. The substrate positioning unit 4 moves the substrate 2 so that the imprint region IR44 is positioned directly below the pattern region PR of the mold 1. The movement direction is indicated by arrow VW. At this time, as the substrate 2 moves, a Couette flow is generated between the mold 1 and the substrate 2, and the gas region GR3 moves on average at a speed that is half of the moving speed of the substrate 2.

That is, the gas moves by a distance that is only half of the movement distance of the substrate 2. The movement direction of the gas is indicated by the arrow VG. The gas region GR3 moves in the direction of the pattern region PR. In FIG. 4A, the reason that the gas was supplied from the gas supply path 7dL on the imprint region IR44 side is that in consideration of the movement of the gas in the present step, the gas is easily supplied to the pattern region PR.

Figure 6A:
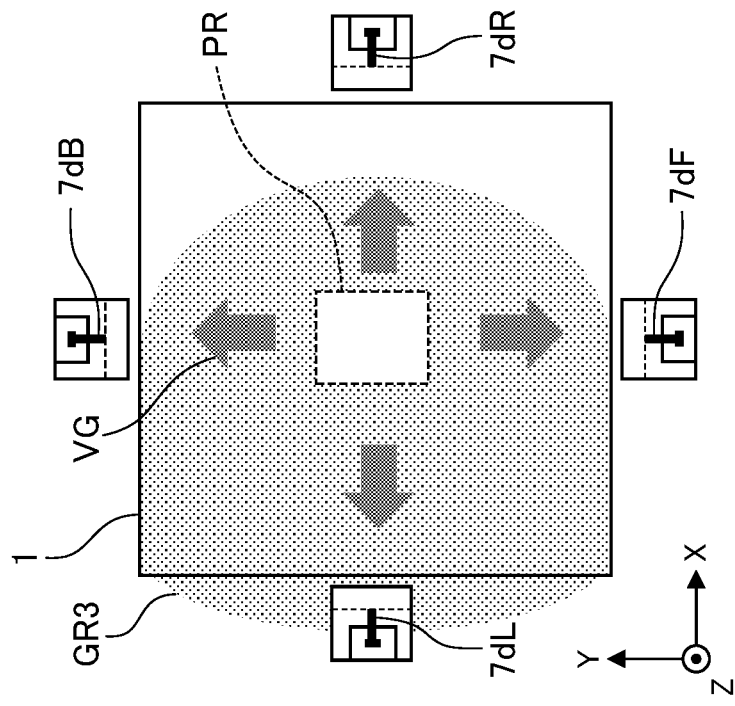
FIGS. 6A and 6B are schematic diagrams of the XY plane, mainly representing the mold 1 and the distribution of a gas in FIGS. 4C and 4D.

FIG. 6A is an XY schematic diagram at the same timing as that of FIG. 4C. The movement of the substrate 2 causes the gas region GR3 to move entirely in the movement direction of the substrate 2. The movement direction of the gas is indicated by the arrow VG.

Figure 4D:
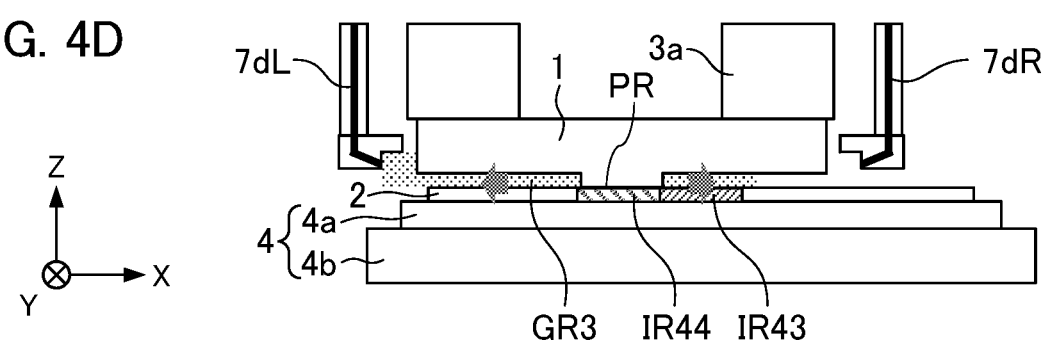

FIG. 4D is a schematic cross-sectional view in the imprint step S103 with respect to the imprint region IR44. In this step, the space between the mold 1 and the substrate 2 is narrowed. Therefore, the gas in the space between the mold 1 and the substrate 2 is pushed out toward the outer peripheral direction of the mold 1.

The flow is such that the gas directly below the pattern region PR spreads over the entire mold 1. At this time, even if the gas is supplied from a gas supply path, the gas does not flow under the mold 1, and therefore, the supply of the gas may be stopped.

Figure 6B:
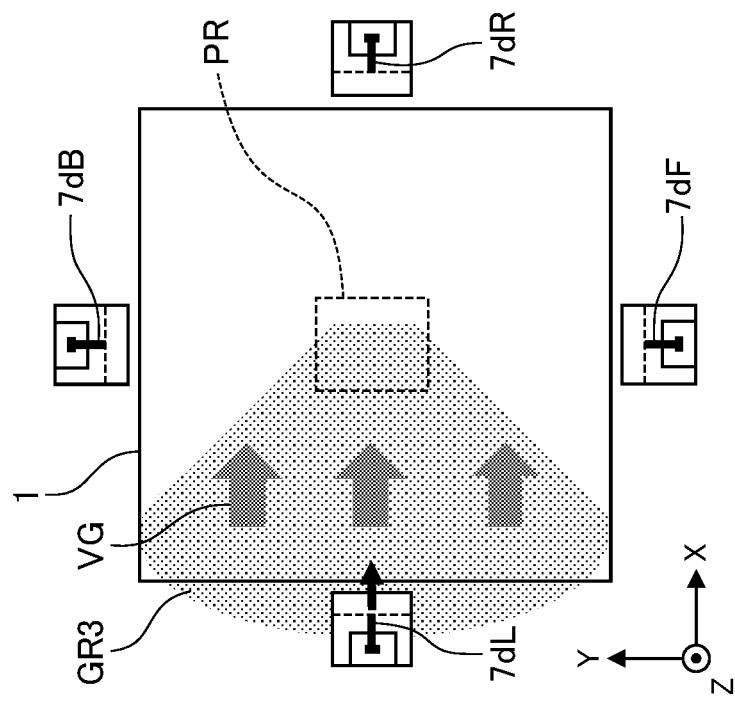

FIG. 6B is an XY schematic diagram at the same timing as that of FIG. 4D. By moving the mold 1 in the direction of the substrate 2, the gas region GR3 is pushed outward from the center of the mold 1 toward the outer peripheral direction.

As described above, it is possible to supply a gas to a space between the pattern region PR of the mold 1 and the imprint region of the substrate 2.

It should be noted that in a case in which the movement direction of the substrate 2 in the moving step S102 changes as in the imprint regions IR07, IR08, and IR09 of FIG. 2, the gas concentration can be improved by providing an additional gas supply. Conversely, if no additional gas is supplied, the gas concentration may decrease in a case in which the movement direction of the substrate 2 changes.

A change in the movement direction of substrate 2 is as follows. That is, in order to switch the imprint region IR07 facing the pattern region PR of the mold 1 to the imprint region IR08, the substrate 2 is moved in the positive X direction and negative Y direction. Next, the substrate is moved in the negative X direction in order to switch from the imprint region IR08 to the imprint region IR09. In this manner, a change in movement direction such that the sign of the movement direction reverses is defined as changing the movement direction. In the above example, the positive X direction corresponds to a first direction and the negative X direction corresponds to a second direction.

Next, taking imprint regions IR07, IR08, and IR09 in FIG. 2 as an example, a gas supply method in a case in which the movement direction of the substrate changes from a first direction to a second direction between imprint regions will be explained with reference to FIG. 7 to FIG. 9.

FIG. 7A is a schematic diagram of the XY plane in a step S104, which is a filling step in an imprint region IR07. The imprint region IR08, which is the next imprint region, is in an upper left direction, in which the gas supply paths 7dL and 7dB exist.

At this time, similar to FIG. 4 to FIG. 6, the gas is supplied from the gas supply path 7dL and the gas supply path 7dB. FIG. 7A shows an example of supplying gas from the gas supply path 7dL.

It should be noted that, at this time, the gas is supplied not only from the gas supply path 7dL, which is a first direction side of the plurality of gas supplying unit and is further supplied in advance from the gas supply path 7dR, which is a second direction side of the plurality of gas supplying unit.

That is, in a case in which the movement direction between the imprint regions of the substrate is to be changed from the first direction to the second direction, a gas is supplied from both the first direction side and the second direction side of the gas supply units at the time of an imprint operation of the imprint region just before the movement direction is to be changed.

This is an operation to pre-supply a gas so as to increase the gas concentration when imprinting the imprint region IR09.

FIG. 7B is a schematic diagram of the XY plane in the mold release step S106 in the imprint region IR07. Because the mold 1 is separated from the substrate 2, the gas that is supplied flows in toward the center of the mold 1. Because the gas is also supplied from the gas supply path 7dR, the gas also flows into the space between the center of the mold 1 and the gas supply path 7dR.

FIGS. 8A and 8B are diagrams for explaining the supply of a gas in an operation example subsequent to FIG. 7 in a case in which the movement direction changes between imprint regions. FIG. 8A is a schematic diagram of the XY plane in the moving step S102 when moving from the imprint region IR07 to the imprint region IR08. At this time, the gas region GR3 moves obliquely toward the lower right direction in the drawing due to the movement of the substrate 2.

FIG. 8B is a schematic XY plan view of the imprint step S103 in the imprint region IR08. Because the space between the mold 1 and the substrate 2 is narrowed, the gas between the mold 1 and the substrate 2 is pushed out, and the gas is spread from the center of the mold 1 to the outer peripheral direction.

Figure 9B:
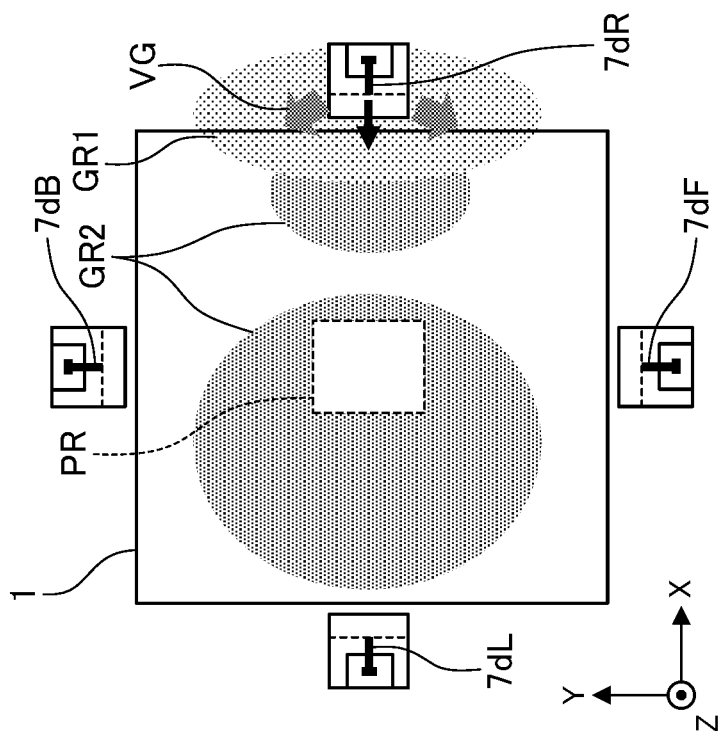
FIG. 9B is a schematic diagram of the XY plane in the mold release step S106 in the imprint region IR08.
Figure 9A:
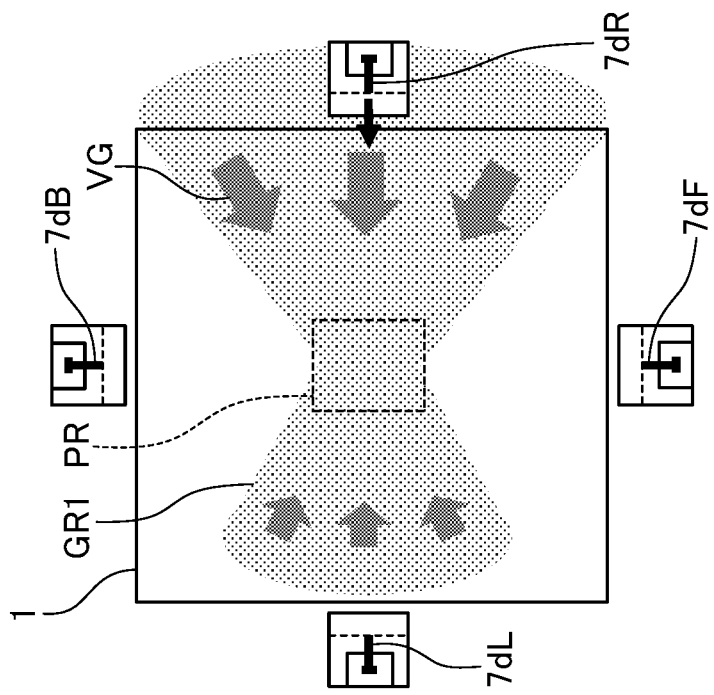
FIG. 9A is a schematic diagram of the XY plane in a filling step S104 in the imprint region IR08.

FIG. 9A is a schematic diagram of the XY plane in a filling step S104 in the imprint region IR08. The imprint region IR09, which is the next imprint region, is the direction of the gas supply path 7dR, and a gas is supplied from the gas supply path 7dR.

A gas region GR2 shows the remaining gas when the imprint process was performed in the imprint region IR08 before the imprint region IR09. In the stage of FIG. 7A, a gas region GR2 also exists in a space between the center of the mold 1 and the gas supply path 7dR due to the gas that was supplied from the gas supply path 7dR. To further add to this, in FIG. 9A, a gas is supplied from the gas supply path 7dR.

FIG. 9B is a schematic diagram of the XY plane in the mold release step S106 in the imprint region IR08. Because the mold 1 is separated from the substrate 2, the gas that is supplied flows in toward the center of the mold 1.

Figure 10A:
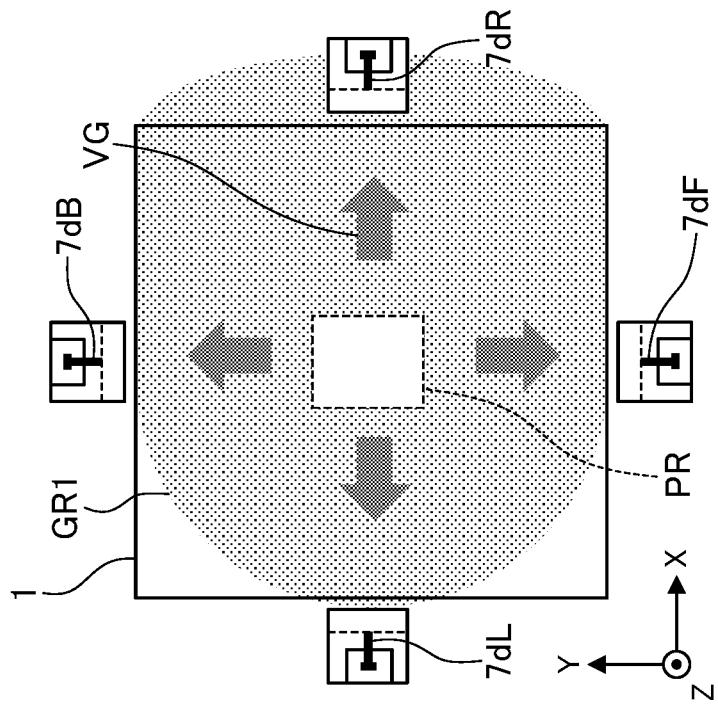
FIG. 10A is a schematic diagram of the XY plane in the moving step S102 when moving from the imprint region IR08 to an imprint region IR09.

FIG. 10A is a schematic diagram of the XY plane in the moving step S102 when moving from the imprint region IR08 to an imprint region IR09. At this time, the gas region GR3 moves due to the movement of the substrate 2.

Figure 10B:
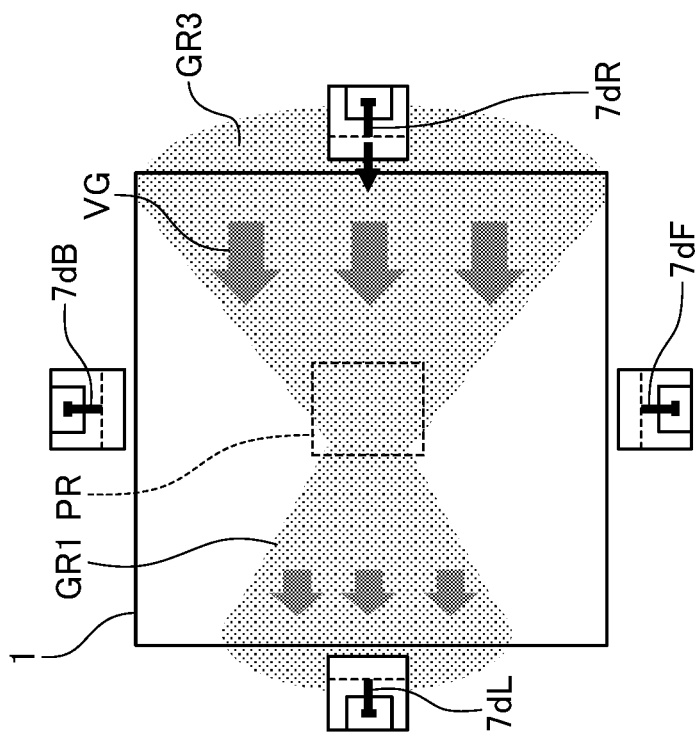
FIG. 10B is a schematic diagram of the XY plane in an imprint step S103 in an imprint region IR09.

FIG. 10B is a schematic diagram of the XY plane in an imprint step S103 in an imprint region IR09. Because the space between the mold 1 and the substrate 2 is narrowed, the gas between the mold 1 and the substrate 2 is pushed out, and the gas is spread from the center of the mold 1 to the outer peripheral direction.

As described above, even in a case in which the movement direction of the substrate changes between the imprint regions, it is possible to keep the gas concentration of the space between the pattern region PR of the mold 1 and the substrate 2 high. In this manner, it is possible to reduce the probability of the occurrence of a defect and to increase the productivity of the imprint apparatus 10.

In a case in which gas is not supplied from the gas supply path 7dR at the stage of FIG. 7A, in FIG. 9A, the gas regions GR2 in the space between the center of the mold 1 and the gas supply path 7dR are no longer present. In this case, there is a possibility that the gas may not reach the center of the mold 1 even if the gas is allowed to flow in during the mold release step, there is a concern that the gas concentration between the patterned region PR of the mold 1 and the substrate 2 may decrease.

Figure 11:
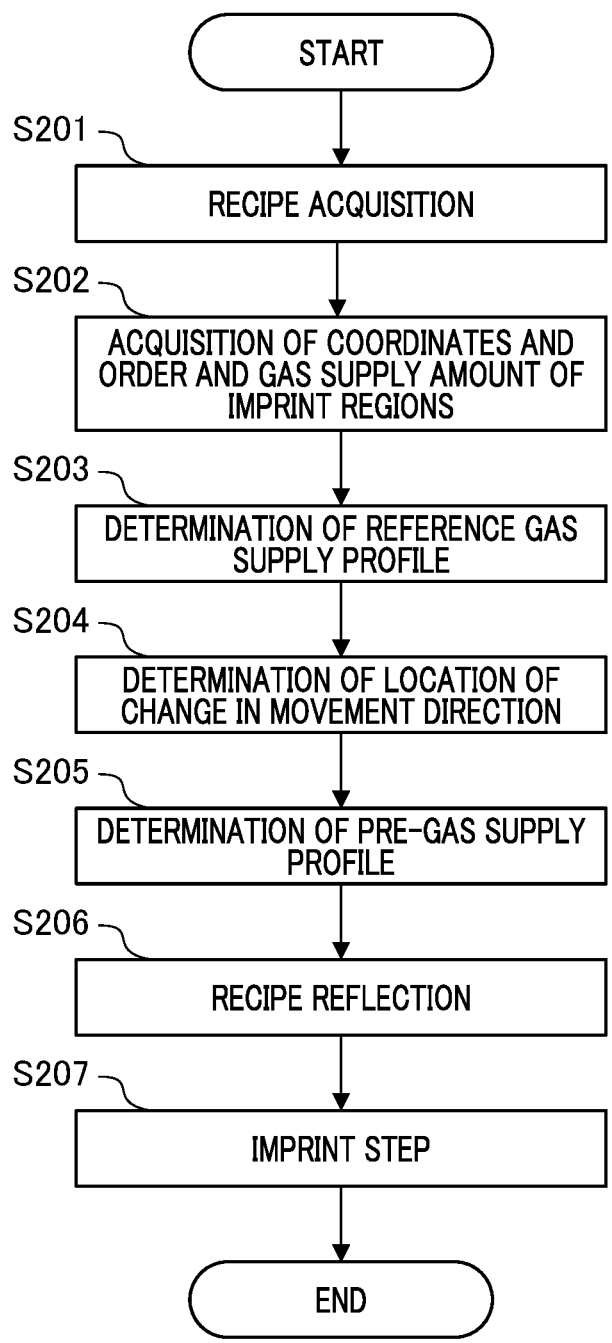
FIG. 11 is a flowchart explaining an operation in which an imprint step is performed by a control unit acquiring an imprint condition in the first embodiment.

The supply of gas as described above is controlled by the control unit 8. The control method of gas supply of the control unit 8 will be explained with reference to FIG. 11. FIG. 11 is a flowchart explaining an operation in which an imprint step is performed by a control unit acquiring an imprint condition in the first embodiment. It should be noted that the operation of each step of the flowchart of FIG. 11 is performed by a computer of the control unit 8 executing a computer program stored in a memory.

In step S201, the control unit 8 acquires an imprint condition (recipe) from a memory or the like (not shown). An imprint condition includes any condition with respect to imprinting, for example, the size of the pattern region PR, the amount of curing energy by the curing unit 6, and the like. The imprint condition is input in advance by the operator of the imprint apparatus 10, or by referring to actual values used in the past.

In step S202, the control unit 8 acquires the coordinates (position information) of the imprint regions and the imprint order information from among the imprint conditions. Further, the control unit 8 acquires gas supply amount information from a gas supply amount map.

In step S203, the control unit 8 determines a gas supply profile that serves as a reference. The reference gas supply profile includes a supply amount of gas for each gas supply path and the timing of the gas supply. Further, the gas supply profile that serves as a reference is determined based on the position information of the imprint region that was acquired in step S202, the imprint order information with respect to the order, and the gas supply amount information.

It should be noted that the gas supply amount (gas supply amount information) and gas supply timing are saved (stored) in advance as a gas supply amount map in which a gas supply amount calculated in advance by adjustment or simulation is mapped in each imprint region. Further, as a gas supply amount map, optimal gas supply amount maps that are adjusted for each process or for each layout of an imprint region are stored.

It should be noted that the gas supply amount map stores data related to a gas supply amount when supplying from a gas supply path on a side of the next imprint region (a side in the movement direction of an imprint region). In step S203, the optimal gas supply amount map that is associated with the target process or the target layout is selected from among plurality of gas supply amount maps.

Thereby, the gas supply profile that includes the optimal gas supply amount and gas supply timing for each imprint region can be determined as a reference gas supply profile.

In step S204, the control unit 8 determines whether there is a case in which a movement direction changes between imprint regions. As a reference of the change in the imprint direction, based on the information acquired in step S202, for example, whether the sign of the movement direction is reversed in each of the X and Y directions is made as a reference.

In step S205, a pre-gas supply profile is determined based on the determination result of step S204. In a case in which the movement direction between imprint regions changes, an additional gas supply is set to be performed in advance, as was explained with reference to FIG. 7 to FIG. 10.

That is, in the imprint region before the movement direction is reversed, a pre-gas supply profile is a gas supply profile for the supply of gas in advance from the gas supply path (the opposite side from the movement direction of the imprint region) in the imprint after the movement direction is reversed. It should be noted that this pre-gas supply corresponds to the operation that has been explained in FIG. 7A. The pre-gas supply amount is calculated by a predetermined formula based on the gas supply amount of the reference gas supply profile.

In step S206, the control unit 8 causes the recipe (imprint condition) to reflect the reference gas supply profile that was determined in step S203 and the pre-gas supply profile that was determined in step S205.

In step S207, the control unit 8 performs an imprint process. The imprint step is a step for the imprint process described in FIG. 3.

As described above, in the first embodiment, a gas supply profile for efficiently increasing the gas concentration is determined.

Next, the method of creating an optimal gas supply amount map for each imprint region that was explained in step S203 will be explained.

Figure 12:
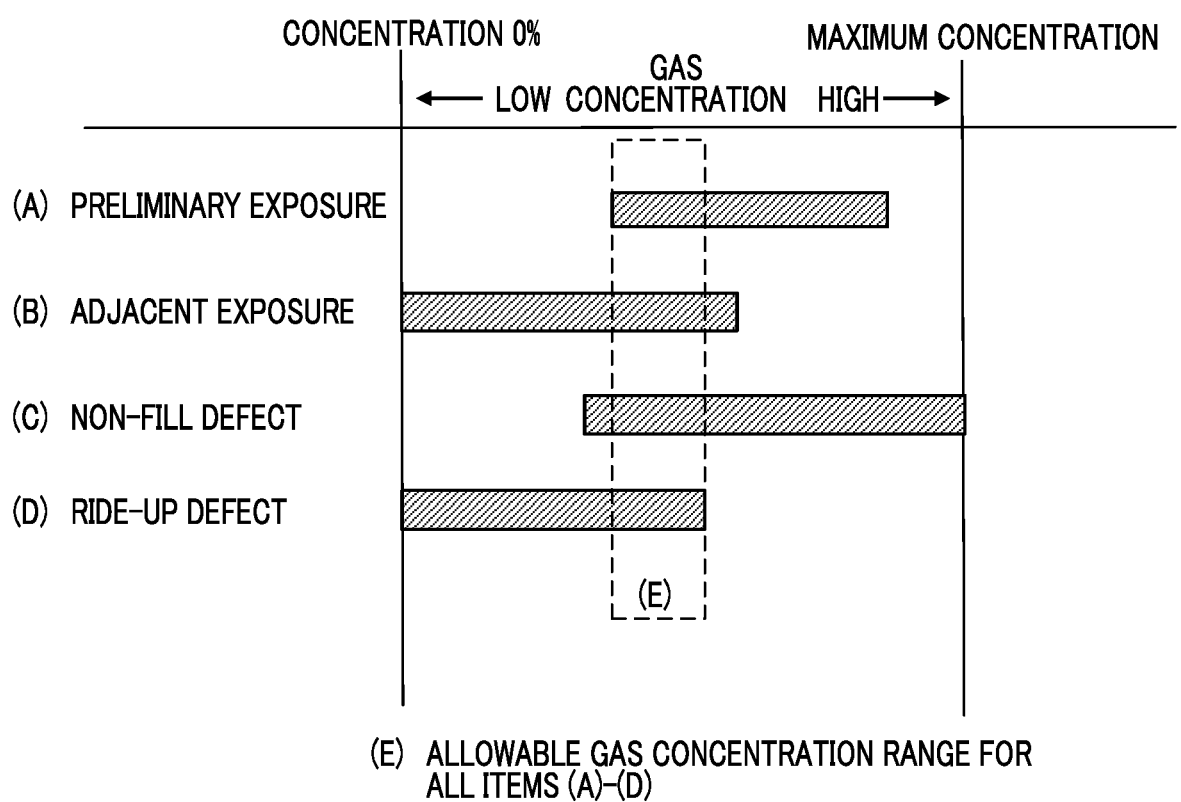
FIG. 12 is a diagram showing the relationship between gas concentration-dependent elements and an allowable value of gas concentration.

FIG. 12 is a diagram showing the relationship between gas concentration-dependent elements and the allowable gas concentration of each element. A preliminary exposure of element (A) is a means for improving positioning accuracy. That is, by preliminary exposure of the imprint material before imprinting, it is possible to increase the viscoelasticity of the imprint material, to reduce the relative vibration of the mold and the substrate, and to improve the alignment accuracy.

However, in a case in which the gas concentration is low, viscoelasticity cannot be obtained at a predetermined preliminary exposure irradiation time, and the alignment accuracy deteriorates. In contrast, in a case in which the gas concentration is high, excessive viscoelasticity will occur, resulting in an alignment residual, and thus an appropriate gas concentration must be maintained.

Thus, the effect of increasing the viscoelasticity of the imprint material by preliminary exposure is highly dependent on the gas concentration. In a case in which the gas concentration is low, because the efficiency is poor, it is necessary to irradiate at a higher illuminance in order to obtain the desired viscoelasticity within a constant irradiation time. The boundary at which the desired viscoelasticity can be obtained at the maximum illuminance that can be irradiated in the pre-exposure and the maximum irradiation time at which the throughput can be satisfied is the allowable lower limit value of the gas concentration.

In contrast, in a case in which the gas concentration is high, although efficiency is high, because the reaction becomes more sensitive, it becomes difficult to control the desired viscoelasticity. That is, the allowable upper limit value of the gas concentration becomes a boundary at which the viscoelasticity can be properly controlled.

An adjacent exposure of element (B) is a phenomenon in which, at the time of the exposure step of S105 of FIG. 3, exposure light that has leaked to the outside of the imprint region is slightly exposed to an adjacent unprocessed imprint region. That is, in the exposure step of curing the imprint material, because the exposure light leaks to the outside of the imprint region, the imprint material on an adjacent imprint region is photosensitized.

Because this unexpected photosensitivity increases the viscoelasticity of the imprint material, the alignment accuracy is degraded. In a case in which further photosensitization occurs, a non-fill defect is caused. Thus, from the viewpoint of the effect on an adjacent imprint region, it is necessary to suitably control the concentration of the replacement gas.

A mechanism (not shown) to block the exposure light with a blade or the like is provided so as to prevent exposure outside of the imprint region. However, it is difficult to shield completely, and light with an intensity of approximately several percent leaks. The effect of this leakage light depends on the gas concentration that is filled on the adjacent imprint region, and in a case in which the gas concentration is high, even a small amount of leakage light will cause photosensitization.

Even if not fully cured, the viscoelasticity of the imprint material is increased, thus affecting the alignment performance. That is, the adjacent exposure of element (B) is such that a boundary that does not affect the alignment performance becomes an allowable upper limit value of the gas concentration. In contrast, in a case in which the gas concentration is low, because photosensitization by leakage light is not generated, there is no restriction on the lower limit of gas concentration.

A non-fill defect in element (C) is a phenomenon in which gas replacement is not sufficiently performed in a case in which the gas concentration is low, thereby residual bubbles are generated and a defect is caused. The allowable lower limit value of the gas concentration is determined from the allowable non-fill defect amount. In contrast, in a case in which the gas concentration is high, the gas replacement is saturated when a certain concentration is exceeded, and thus, there is no restriction on the upper limit of the gas concentration.

A ride-up defect of element (D) is a phenomenon in which the imprint material accumulates at the edge of the mold 1 by repeated imprinting, thereby resulting in insufficient imprinting at the outer peripheral portion of the imprint region, which becomes a defect. At the time of the imprint step of S103 of FIG. 3, this phenomenon causes the imprint material that is raised on the edge portion of the mold 1 outside the patterned region to be cured by leakage light, so that at the time of mold release, the cured imprint material peels off from the substrate 2 at the edge portion of the mold 1, and adheres to the mold 1 side.

Adhered imprint material is deposited by repeated imprinting, and when the deposition progresses to a certain level, an imprint failure occurs at the vicinity of the outer peripheral portion of the imprint region, resulting in a defect. Further, as the deposition progresses, the deposited imprint material peels off from the mold, and by imprinting on a peeled-off location, the problem of damaging the mold 1 also occurs.

Similar to an adjacent exposure of element (B), a ride-up defect of element (D) is due to photosensitization caused by leakage light of the exposure light, and in a case in which the gas concentration is high, curing becomes easier and deposition on the edge portion is promoted.

In contrast, in a case in which the gas concentration is low, the deposition at the edge portion does not progress because curing can be suppressed. That is, the allowable upper limit value of gas concentration is bounded by whether or not the deposition of the resist material at the edge portion of the mold 1 progresses.

Further, the allowable upper limit value is found from experimental results to be a lower concentration than the adjacent exposure of element (B). In contrast, in a case in which the gas concentration is low, because photosensitivity will no longer occur at the edge portion of mold 1, the allowable lower limit is not constrained.

It is desirable to adjust the gas concentration within the range that is shown in (E) so that the gas concentration satisfies all of the elements (A) to (D) explained above. It should be noted that the adjustment of the gas supply amount is performed according to the flow that was shown in FIG. 11, and the gas supply amount of step S203 is adjusted repeatedly until the conditions of elements (A) to (D) are satisfied.

With respect to the concentration, in the vicinity of the center and the outer peripheral portion of the substrate 2, even if filled with the same gas supply amount, the actual gas concentration is different. There is a large gap between the outside edge of the substrate 2 and the substrate positioning unit 4, and because the filled gas diffuses from that gap, the gas concentration becomes low.

This is, in a case in which the gas was filled at a constant supply amount, the concentration of the gas is lower in the outer peripheral portion of the substrate than in the vicinity of the center, and concentration unevenness is generated in the substrate. Although it is desirable to adjust the gas supply so as to make the gas concentration uniform, it is very difficult to measure the gas concentration. Therefore, in a first embodiment, the gas concentration that satisfies all of the elements (A) to (D) of FIG. 12 in all of the imprint regions is determined indirectly.

It is understood from FIG. 12 that the allowable amplitude of the gas concentration range (E) that satisfies all is determined by the allowable lower limit value of element (A) and the allowable upper limit value of element (D). Therefore, during the preliminary exposure in item (A), the lower limit of the gas supply amount can be determined by fixing the preliminary exposure conditions at the maximum adjustable illuminance and maximum irradiation time, and then increasing the gas supply amount until the relative vibration of the mold 1 and substrate 2 at the time of positioning is attenuated to the desired vibration level.

In contrast, the lower limit of the gas supply amount may be determined by setting the gas supply amount at the initial adjustment high, and by reducing the gas supply amount until a boundary is found where the relative vibration of the mold 1 and the substrate 2 cannot be attenuated to a desired vibration level.

It should be noted that, in practice, it is desirable to seek a gas supply amount at a value that has a margin in the maximum illuminance and maximum irradiation time, for example, 80 to 90% of the maximum dose (illuminance× irradiation time), in order to ensure an adjustment range for adjusting the relative vibration amount of the mold 1 and the substrate 2, which is the original purpose of the preliminary exposure.

An example of a method of creating an optimal gas supply amount map as described above will be explained with reference to FIG. 13.

Figure 13:
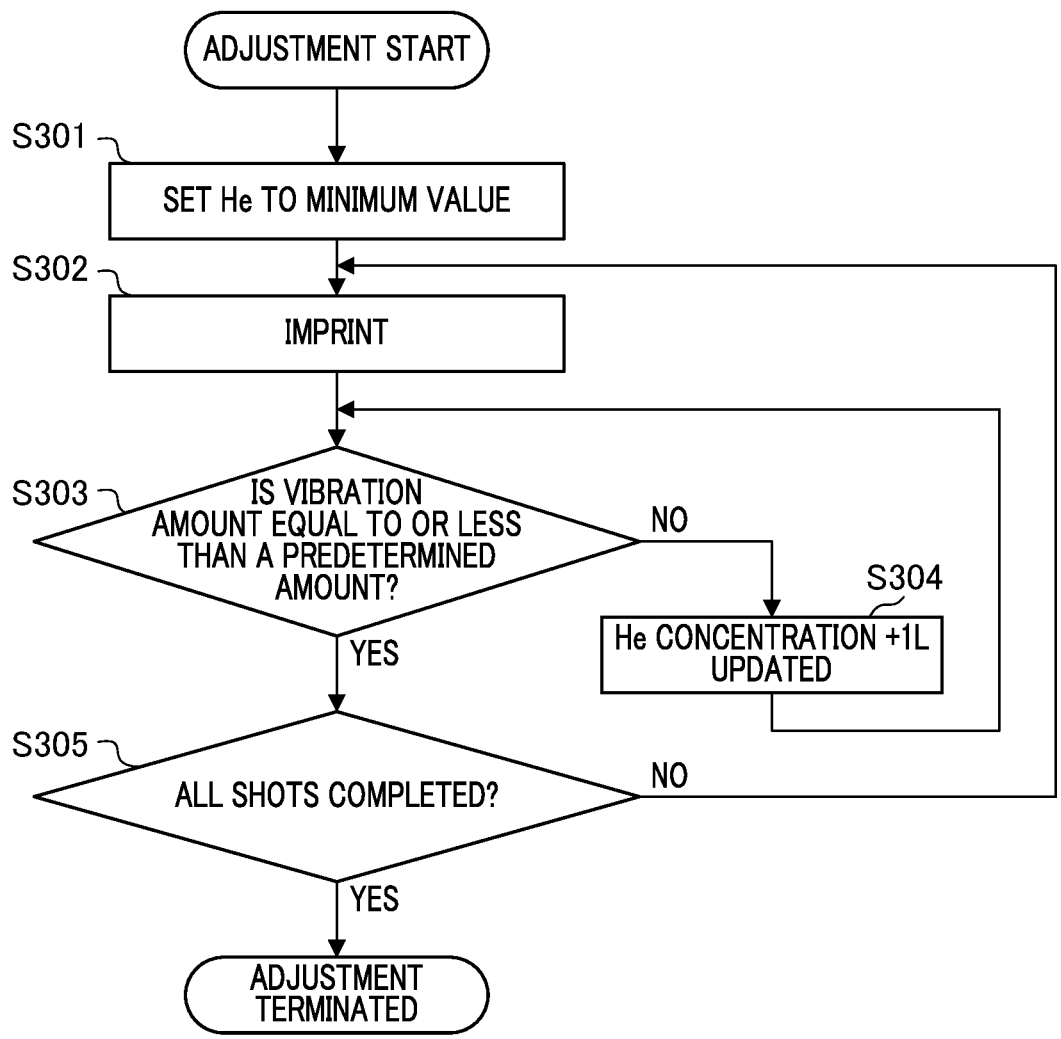
FIG. 13 is a diagram showing an example of a flow for creating an optimal gas supply amount map for each imprint region in the first embodiment.

FIG. 13 is a diagram showing an example of a flow of creating an optimal gas supply amount map for each imprint region in the first embodiment. It should be noted that the operation of each step of the flowchart of FIG. 13 is performed by a computer of the control unit 8 in the imprint apparatus executing a computer program that is stored in a memory.

In the example of FIG. 13, in step S301, the He flow rate of all shot regions is set to a minimum value, and in step S302, an imprint of each shot region is performed sequentially. In this case, preliminary exposure is performed prior to imprinting. Further, in a preliminary exposure, the illuminance is set to, for example, the maximum illuminance, and the irradiation time is set to, for example, the maximum.

Then, the gas supply amount is increased until the relative vibration amount of the mold 1 and substrate 2 at the time of positioning is attenuated so as to be equal to or less than a predetermined value. That is, the gas supply amount is adjusted in a state in which the illuminance and the irradiation time in the preliminary exposure have been set to a predetermined condition so that the relative vibration amount is attenuated to equal to or less than a predetermined amount.

For that purpose, in step S303, the relative vibration amount of the mold 1 and the substrate 2, which is an imprint result, is statistically processed so as to determine whether the vibration amount is attenuated to a desired amount (equal to or less than a predetermined value). As a statistical process, for example, a method such as determining a standard deviation while time-slicing time-series data of an alignment signal by a time width is used.

In a case in which the vibration amount has not been attenuated to the desired vibration amount, in step S304, the He flow rate is increased, for example, by 1 L/min, the setting value is updated, and the return to step S303 is repeated until the vibration amount is attenuated to equal to or less than a predetermined value. The increased amount may be increased depending on the sensitivity of the effect in the flow amount value. In a case of YES in step S303, the He flow rate value (gas supply amount) with respect to that shot region is stored.

In step S305, it is determined as to whether processing has been performed for all shot regions, and in the case of NO, the process returns to step S302, and steps S302 to S305 are repeated. In step S305, the adjustment is terminated when the adjustment of the He flow rate is terminated for all the shot regions. Thereby, an optimal gas supply amount map of each imprint region can be created.

Figure 14:
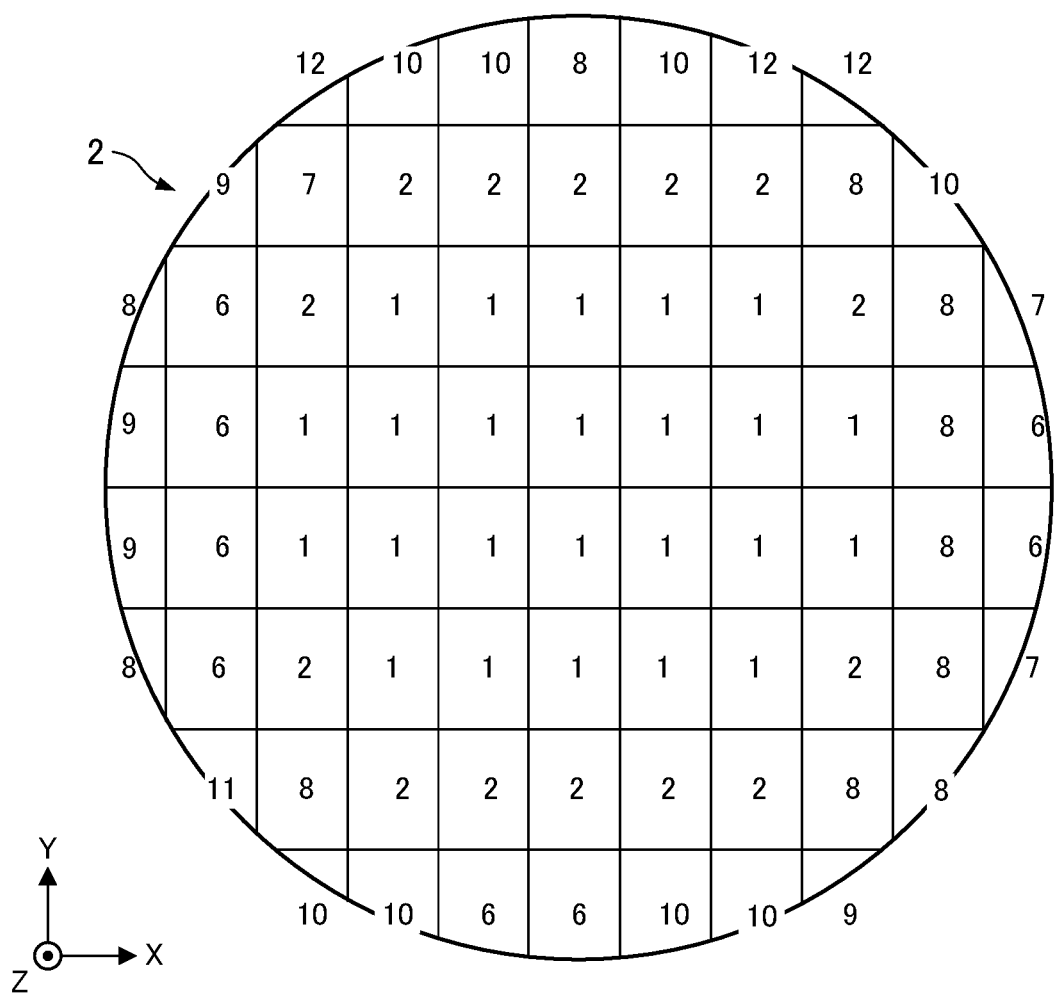
FIG. 14 is a diagram showing an example of an optimal gas supply amount map.

FIG. 14 is a diagram showing an example of an optimal gas supply amount map. By an adjustment method of the gas supply amount as was explained in FIG. 13, by performing an adjustment in each imprint region, as shown in FIG. 14, an optimal gas supply amount map in which the optimal gas supply amount of each imprint region for the entire substrate 2 is stored is created.

The numerical values described in each imprint region of FIG. 14 show the flow rate (L/min) of the gas supply as an example. As shown in FIG. 14, the gas supply amount at the center of the substrate 2 is small, and it can be understood that a greater gas supply amount is required toward the outer peripheral portion of the substrate 2.

Second Embodiment

In a second embodiment, further, in accordance with an optimal gas supply amount map, an imprint is performed, and whether a ride-up defect of element (D) is within an allowable range is checked by a defect inspection apparatus. Then, the gas supply amount information of each imprint region is adjusted so that the defect amount of the outer peripheral portion of the imprint region is equal to or less than a predetermined value.

That is, in a case in which a defect is unacceptable, the boundary of the lower limit allowable value of the preliminary exposure of the element (A) is further precisely sought in order to further reduce the gas supply amount. Nevertheless, in a case in which the element (D) cannot be satisfied, in the current hardware configuration, because this means that an allowable gas concentration range (E) does not exist for all items, improvement of the maximum illuminance of the preliminary exposure or extending the maximum irradiation time by reducing the throughput is performed.

Figure 15:
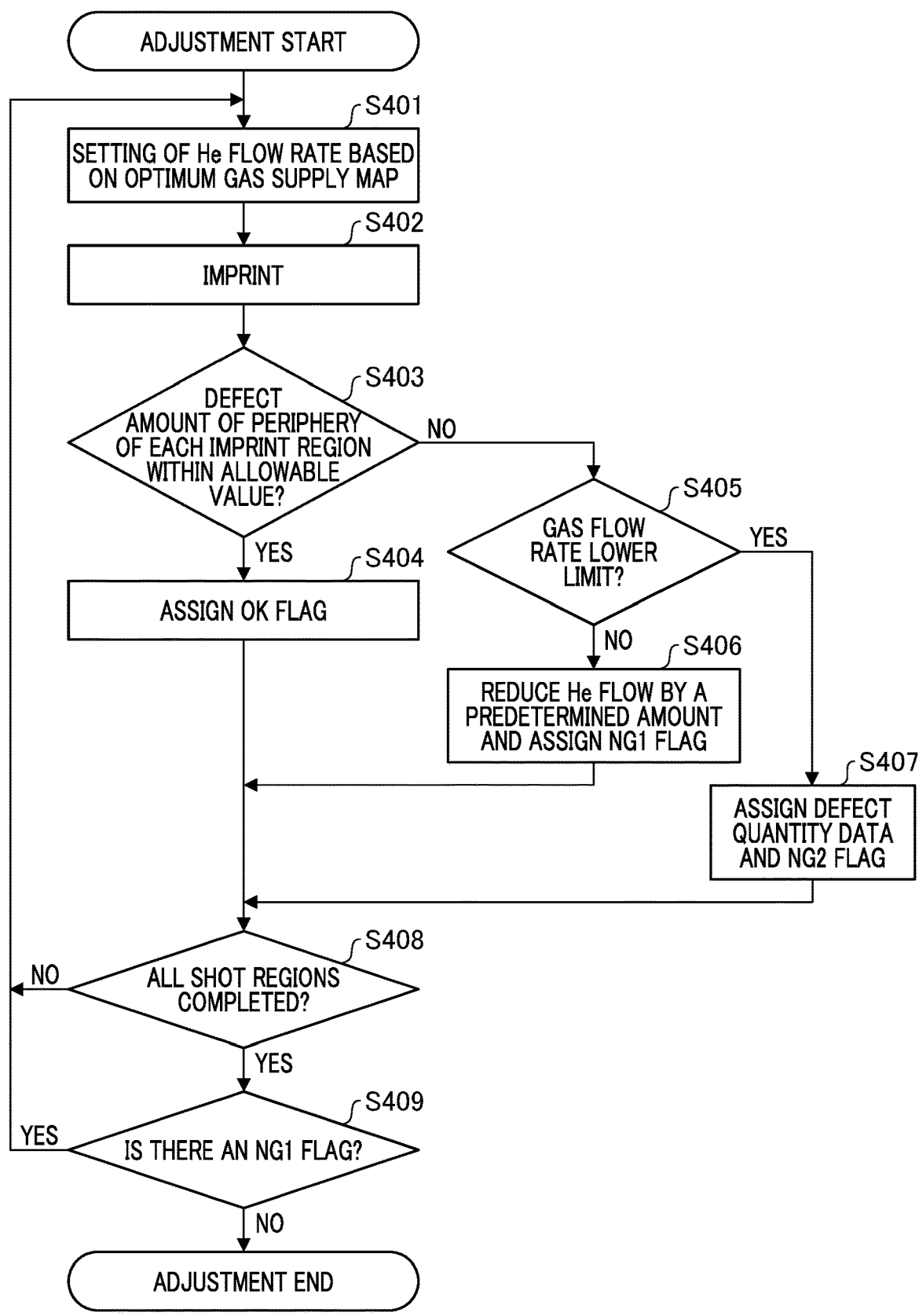
FIG. 15 is a flowchart showing an example of a flow for modifying an optimal gas supply amount map in the second embodiment so that a defect is within an allowable range.

FIG. 15 is a flowchart showing an example of a flow for modifying an optimal gas supply amount map in the second embodiment so that a defect is within an allowable range. The operation of each step of the flow chart of FIG. 15 is performed by a computer in the control unit 8 and a computer in a predetermined defect measurement apparatus, each of which is configured to execute a computer program stored in a memory.

In step S401, the control unit 8 sets the flow rate of He based on the optimal gas supply amount map as in FIG. 14, and in step S402, performs imprinting. It should be noted that in that case, preliminary exposure may be performed prior to imprinting.

At step S403, the defect inspection apparatus determines whether the defect amount of the outer peripheral portion (periphery) of each imprint region is within an allowable value. If YES, in step S404, the defect inspection apparatus assigns an OK flag to that shot region and the process proceeds to step S408.

In a case of NO in step S403, in step S405, the defect inspection apparatus determines whether the flow rate of the He gas that is set in that shot region has reached a predetermined lower limit. Here, a lower limit refers to the lower limit of the width of (E) of FIG. 12.

In a case of NO in step S405, in step S406, by reducing the flow rate of He by a predetermined amount, and assigning an NG1 flag to that shot region as a flag, the defect inspection apparatus proceeds to step S408.

In a case of YES in step S405, in step S407, in addition to the gas supply amount for that shot region, the defect inspection apparatus assigns the defect amount data and the NG2 flag, and the process proceeds to step S408.

In step S408, the defect inspection apparatus determines whether the processes from step S401 to step S407 are completed in all shot regions, and if they are not completed, the process returns to step S401 and performs the above-described process for the next shot region.

In a case of YES in step S408, in step S409, the defect inspection apparatus determines whether there are any shot regions with an NG1 flag remaining, and if YES, the process returns to step S401, and repeats the above-described process. Then, in step S409, when the NG1 flag is removed, the adjustment flow of FIG. 15 is terminated.

Thus, by performing the adjustment flow of FIG. 15, a modified optimal gas supply amount map is generated. That is, the gas supply amount map showing the gas supply amount information for each imprint region is modified and saved.

Furthermore, each shot region of the optimal gas supply amount map that was generated by FIG. 15 is assigned a gas supply amount and an OK flag, or a gas supply amount, an NG2 flag, and defect amount data. It should be noted that the flow of FIG. 15 may be performed fully automatically while conveying the substrate between the imprint apparatus and the defect inspection apparatus, or it may be partially performed manually by a human operator.

The imprint apparatus controls the gas supply based on the gas supply amount of the shot region when performing an imprint operation based on this modified optimal gas supply amount map. At that time, the gas supply is controlled as it is with respect to a shot region that is assigned an OK flag.

In contrast, with respect to a shot region to which an NG2 flag has been assigned, based on the assigned defect amount data, control is performed to either increase the maximum illuminance of the preliminary exposure or lower the throughput so as to extend the maximum irradiation time. Thereby, defects can be reduced.

It should be noted that in the first embodiment and the second embodiment, elements (A) to (D) have different degrees of influence on the gas concentration due to the underlayer conditions of the substrate 2 and the process conditions (characteristic conditions of the substrate) such as the imprint material. Therefore, in a case in which a plurality of process types (characteristics of the substrate) exists, it is desirable to create a gas supply amount map for each process by a method that is similar to that shown in FIG. 13 and FIG. 15.

Furthermore, because a gas concentration distribution that corresponds to the surface position of the substrate 2 exists, it is desirable to create a gas supply amount map by the layout conditions (position on the substrate) of the imprint regions. That is, it is desirable that the gas supply amount information for each imprint region be stored corresponding to each characteristic condition of the substrate or to each layout of the imprint regions.

It should be noted that a gas supply amount map created for each process and each layout is managed on a database of the apparatus or external apparatus, and is associated with the corresponding gas supply amount map as part of the parameters of a recipe for setting the various imprint conditions that are created by the user.

The gas supply amount map can be created by referring to the gas supply value of the imprint region of the gas supply amount map that has already been created and is closest to the imprint region coordinates of the target, thereby eliminating some of the adjustments required to create the gas supply amount map. Alternatively, the cited supply values may be fine-tuned.

Thus, the imprint apparatus 10 determines the gas supply profile based on the optimal gas supply amount map of each previously adjusted imprint region, the position information of the imprint regions, and the imprint order information relating to the imprint order, and performs imprinting. Accordingly, it is possible to provide an imprint apparatus that balances positioning accuracy and defects.

Third Embodiment

In the first embodiment and the second embodiment, with respect to a case in which continuous imprinting operations are performed, a gas supply flow capable of satisfying each element that is dependent on gas concentration, and an adjustment method of a gas supply amount were explained.

In a third embodiment, using the adjusted gas supply amount map, a skip process of an imprint region, or a process in a case in which the order of imprinting is changed, will be explained.

Figure 16:
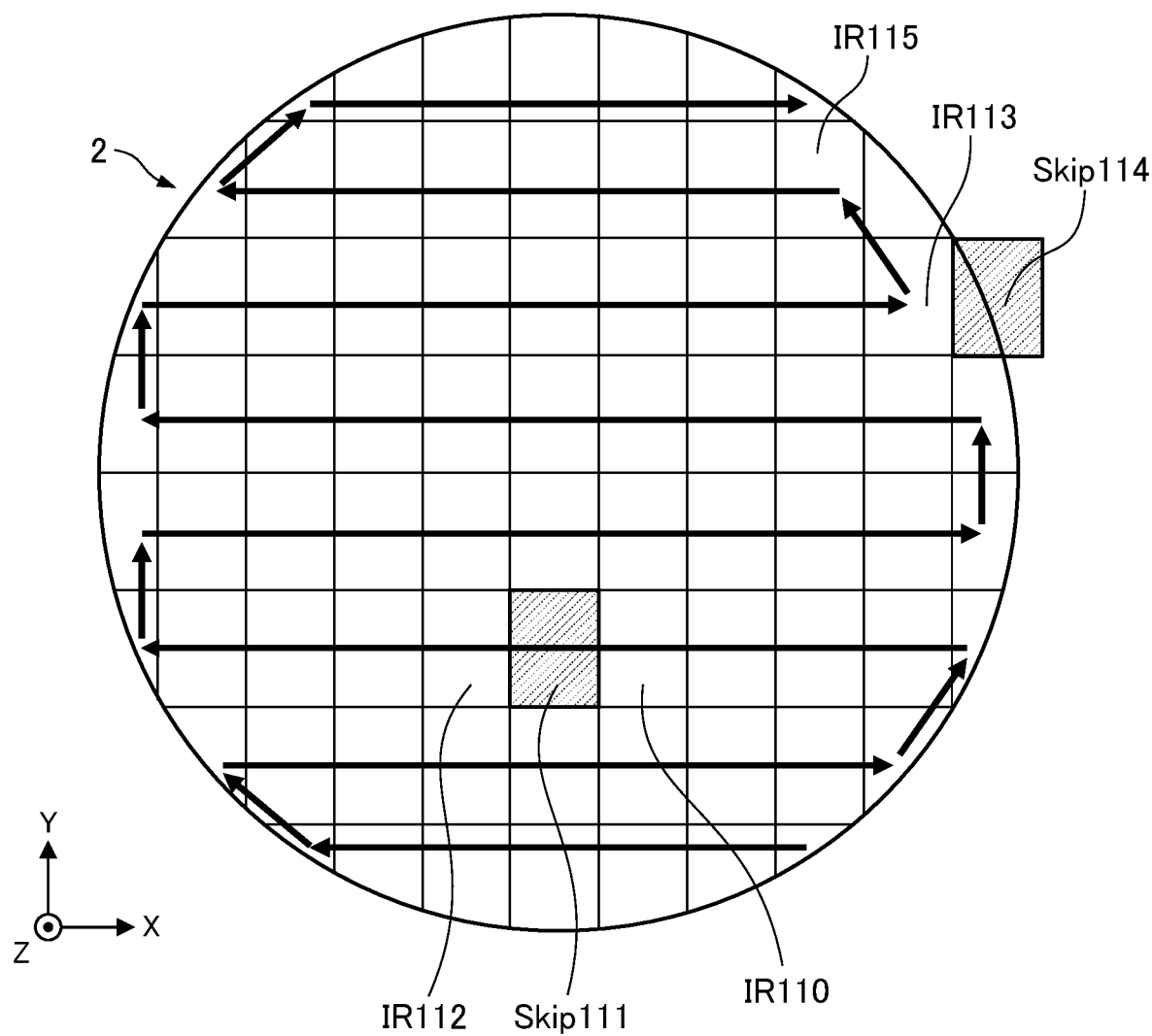
FIG. 16 is a diagram for explaining an example of a substrate that includes a skip region in a third embodiment.

FIG. 16 is a diagram for explaining an example of a substrate that includes a skip region in the third embodiment, and shows a case in which a region in which a skip process is performed without imprinting has been set, in contrast to the imprint layout and imprint order that was shown in FIG. 2. It should be noted that, a skip processing region is, for example, an imprint region in which there is some abnormality, such as the presence of foreign matter, and is different in each substrate.

In a case in which the imprint region Skip 111 is skipped, for example, the movement direction of the substrate 2 does not change regardless of the presence or absence of a skip. In that case, the pre-gas supply profile of step S205 of the control flow of gas supply shown in FIG. 11 is a gas supply value that is calculated by a predetermined calculation formula by using the optimal gas supply amount map, while a nozzle that supplies gas is left unchanged.

Specifically, for example, the average value of the gas supply values that were set in IR110 and IR112 is multiplied by a predetermined factor to be made a gas supply value.

It should be noted that in a case of a skip, by what formula the gas supply value of the imprint region to be skipped and the gas supply value of the periphery thereof are determined are pre-determined. It should be noted that it is desirable that the formula and the coefficient that are used in the formula differ depending on the coordinates of the imprint region to skip. For example, it is desirable to change the formula and the coefficient in a case in which the imprint region to be skipped is around the center of the substrate and in a case in which it is around the edge of the substrate.

It should be noted that the optimal gas supply amount map is updated so that a setting value is lowered with respect to a shot after the skip. That is, because the He concentration of the target shot increases in accordance with the amount of movement before and after the skip, the coefficient inversely proportional to the movement amount is updated to the flow rate value that is multiplied by the current setting value.

In contrast, in a case in which the imprint region Skip 114 is skipped, the substrate 2 is moved from IR113 to IR115. The movement direction of the substrate 2 in a case in which there is no skip is in the negative X direction (first direction) with respect to the mold 1, whereas the movement direction in the positive X direction (second direction) is changed.

At this time, the pre-gas supply profile of step S205, for example, selects nozzles of both the positive X direction and the negative X direction. In addition, the gas supply amount is, for example, calculated by a predetermined formula by acquiring the setting values of IR113 and IR115 from the optimal gas supply amount map, and creating the pre-gas supply profile of step S205. The optimal gas supply amount map may be updated by the method that was explained in the example of the imprint region Skip 111 or the like.

Thus, in a case in which a part of the imprint regions are skipped, the gas supply flow of the next imprint region after the skipped region is determined based on the position information of the imprint region to be skipped, the movement direction, and the information of the optimal gas supply amount map that was created in advance. Accordingly, it is possible to provide a good imprint.

OTHER EMBODIMENTS

Next, a method of manufacturing an article (a semiconductor integrated circuit (IC) element, a liquid crystal display element, or a Micro-Electro Mechanical System (MEMS), or the like) using the above described imprint apparatus will be explained. An article is manufactured by performing a post-processing step (the process of manufacturing an article from an imprinted substrate) through an imprint step of imprinting a substrate to which an imprint material has been applied, by using the imprint apparatus described above.

The post-processing step includes a step of developing the substrate, etching, resist stripping, dicing, bonding, packaging, or the like. According to the method of manufacturing an article by using the present invention, the concentration of the replacement gas can be efficiently ensured, a proper replacement gas concentration can be ensured, the productivity can be improved, defects can be reduced, yields can be improved, and an article of a higher quality than a conventional article can be manufactured.

While the present invention has been described with reference to exemplary embodiments, it is to be understood that the invention is not limited to the disclosed exemplary embodiments. The scope of the following claims is to be accorded the broadest interpretation to encompass all such modifications and equivalent structures and functions.

In addition, as a part or the whole of the control according to the embodiments, a computer program realizing the function of the embodiments described above may be supplied to the imprint apparatus through a network or various storage media. Then, a computer (or a CPU, an MPU, or the like) of the imprint apparatus may be configured to read and execute the program. In such a case, the program and the storage medium storing the program configure the present invention.

This application claims the benefit of Japanese Patent Application No. 2022-047720 filed on Mar. 24, 2022, which is hereby incorporated by reference herein in its entirety.

What is claimed is:

1. An imprint apparatus, comprising:
a gas supply unit configured to supply a gas to a space between a mold and a substrate; and
at least one processor or circuit configured to function as:
a control unit configured to control the gas supply unit and an imprint operation, and to perform a preliminary exposure with respect to an imprint material in order to reduce a relative vibration of the mold and the substrate,
wherein the control unit is configured to adjust a gas supply amount that is supplied from the gas supply unit for each imprint region in a state in which illuminance and irradiation time in the preliminary exposure are set to a predetermined condition so that a relative vibration amount is attenuated to be equal to or less than a predetermined amount.

2. The imprint apparatus according to claim 1, wherein the control unit is configured to adjust the gas supply amount for each of the imprint regions so that a defect amount of the outer peripheral portion of each of the imprint regions is equal to or less than a predetermined value.

3. The imprint apparatus according to claim 1, wherein the control unit is further configured to adjust the gas supply amount for each of the imprint regions corresponding to each characteristic condition of the substrate or to each layout of the imprint regions.

4. The imprint apparatus according to claim 1, wherein the gas supply amount for each of the imprint regions is stored as a gas supply amount map.

5. The imprint apparatus according to claim 4, wherein the gas supply amount map is stored corresponding to each characteristic condition of the substrate or to each layout.

6. A method of manufacturing an article by using the imprint apparatus according to claim 1, the method of manufacturing an article comprising:
adjusting a gas supply amount that is supplied from the gas supply unit for each of the imprint regions in a state in which an illuminance and an irradiation time in the preliminary exposure are set to a predetermined condition so that a relative vibration amount is attenuated to be equal to or less than a predetermined amount, and
developing the substrate on which an imprinting has been performed.

7. An imprint apparatus, comprising:
a gas supply unit configured to supply a gas to a space between a mold and a substrate; and
at least one processor or circuit configured to function as:
a control unit configured to control the gas supply unit and an imprint operation,
wherein the control unit is configured to control the gas supply unit to adjust the gas supply amount for each imprint region so that a defect amount of the outer peripheral portion of each imprint region is equal to or less than a predetermined value.

8. The imprint apparatus according to claim 7, wherein the control unit is further configured to perform a preliminary exposure on an imprint material in order to reduce a relative vibration of the mold and the substrate, and
wherein the control unit is further configured to control the gas supply unit to adjust the gas supply amount for each imprint region in a state in which illuminance and irradiation time in the preliminary exposure are set to a predetermined condition so that a relative vibration amount is attenuated to be equal to or less than a predetermined amount.

9. The imprint apparatus according to claim 7, wherein the gas supply amount for each of the imprint regions is stored as a gas supply amount map.

10. The imprint apparatus according to claim 9, wherein the gas supply amount map is stored corresponding to each characteristic condition of the substrate or to each layout.

11. The imprint apparatus according to claim 7, wherein the control unit is further configured to adjust the gas supply amount information for each of the imprint regions corresponding to each characteristic condition of the substrate or to each layout of the imprint regions.

12. A method of manufacturing an article by using the imprint apparatus according to claim 7, the method of manufacturing an article comprising:
adjusting a gas supply amount that is supplied from the gas supply unit for each imprint region so that a defect amount of the outer peripheral portion of each imprint region is equal to or less than a predetermined value, and
developing the substrate on which an imprinting has been performed.

13. An imprint method for sequentially imprinting a plurality of imprint regions of a substrate by using an imprint apparatus comprising a gas supply unit configured to supply a gas to a space between a mold and a substrate and at least one processor or circuit configured to function as a control unit configured to control the gas supply unit and an imprint operation, and to perform a preliminary exposure on an imprint material in order to reduce a relative vibration of the mold and the substrate, the imprint method comprising:
adjusting a gas supply amount that is supplied from the gas supply unit for each of the imprint regions in a state in which an illuminance and an irradiation time in the preliminary exposure are set to a predetermined condition so that a relative vibration amount is attenuated to be equal to or less than a predetermined amount.

14. An imprint method for sequentially imprinting a plurality of imprint regions on a substrate by using an imprint apparatus, wherein the imprint apparatus comprises a gas supply unit configured to supply a gas to a space between a mold and a substrate and at least one processor or circuit configured to function as a control unit configured to control the gas supply unit and an imprint operation, the imprint method comprising:

adjusting a gas supply amount that is supplied from the gas supply unit for each imprint region so that a defect amount of the outer peripheral portion of each imprint region is equal to or less than a predetermined value.

15. A non-transitory computer-readable storage medium storing a computer program configured to cause an imprint apparatus to execute an imprint method for sequentially imprinting a plurality of imprint regions on a substrate, the imprint apparatus comprising a gas supply unit configured to supply a gas to a space between a mold and a substrate and at least one processor or circuit configured to function as a control unit configured to control the gas supply unit and an imprint operation, and to perform a preliminary exposure on an imprint material in order to reduce a relative vibration of the mold and the substrate, the imprint method comprising:

adjusting a gas supply amount that is supplied from the gas supply unit for each of the imprint regions in a state in which an illuminance and an irradiation time in the preliminary exposure are set to a predetermined condition so that a relative vibration amount is attenuated to be equal to or less than a predetermined amount.

16. A non-transitory computer-readable storage medium storing a computer program configured to cause an imprint apparatus to execute an imprint method for sequentially imprinting a plurality of imprint regions on a substrate, the imprint apparatus comprising a gas supply unit configured to supply a gas to a space between a mold and a substrate and at least one processor or circuit configured to function as a control unit configured to control the gas supply unit and an imprint operation, the imprint method comprising:

adjusting a gas supply amount that is supplied from the gas supply unit for each imprint region so that a defect amount of the outer peripheral portion of each imprint region is equal to or less than a predetermined value.

* * * * *